United States Patent

Kohara et al.

Patent Number: 6,100,542
Date of Patent: Aug. 8, 2000

[54] INP-BASED HEMT WITH SUPERLATTICE CARRIER SUPPLY LAYER

[75] Inventors: Teruaki Kohara, Kariya; Koichi Hoshino, Oobu; Takashi Taguchi, Anjo, all of Japan

[73] Assignee: Denso Corporation, Kariya, Japan

[21] Appl. No.: 08/974,731

[22] Filed: Nov. 19, 1997

[30] Foreign Application Priority Data

Nov. 19, 1996 [JP] Japan .................................. 8-308494
Oct. 16, 1997 [JP] Japan .................................. 9-283403

[51] Int. Cl.[7] ...................... H01L 29/267; H01L 29/205; H01L 29/778
[52] U.S. Cl. .............................................. 257/20; 257/194
[58] Field of Search ...................... 257/20, 194

[56] References Cited

U.S. PATENT DOCUMENTS 4,695,857  9/1987  Baba et al. ........................ 257/194 X
4,833,508  5/1989  Ishikawa et al. .................... 257/24
4,882,609  11/1989  Schubert et al. .................... 257/194
5,449,928  9/1995  Matsugatani et al. ............... 257/194

FOREIGN PATENT DOCUMENTS 62-11279   1/1987  Japan .
6-140435   5/1994  Japan .
7-283493   7/1995  Japan .
2 285 175  6/1995  United Kingdom .

*Primary Examiner*—John Guay
*Attorney, Agent, or Firm*—Pillsbury Madison & Sutro LLP

[57] ABSTRACT

A semiconductor device includes a semi-insulating substrate. A channel layer is formed on the semi-insulating substrate. An electron supply layer is formed on the semi-insulating substrate for generating a two-dimensional electron gas. The electron supply layer includes a doped superlattice layer. The superlattice layer includes layers of $In_XAl_{1-X}As$ and layers of $In_YAl_{1-Y}As$ which alternate with each other, where $0 \leq X \leq 1.0$ and $0 \leq Y \leq 1.0$, and X differs from Y.

17 Claims, 25 Drawing Sheets

DEVIATION FROM LATTICE CONSTANT
(5.869 ANGSTROMS) OF $In_{0.52}Al_{0.48}As$ (Å)

INP-BASED HEMT WITH SUPERLATTICE CARRIER SUPPLY LAYER

BACKGROUND OF THE INVENTION

1. Field of the Invention

This invention relates to a semiconductor device in which a channel layer and an electron supply layer are formed on a semi-insulating substrate to use a two-dimensional electron gas.

2. Description of the Related Art

A high electron mobility transistor (HEMT) is a field-effect semiconductor device in which a channel layer and an electron supply layer are formed on a semi-insulating substrate to use carriers called a two-dimensional electron gas.

Generally, HEMT's can operate at high speeds. In addition, HEMT's can generate a high power output. Furthermore, HEMT's have low noise figures.

Prior-art HEMT's have problems as will be indicated later.

SUMMARY OF THE INVENTION

It is an object of this invention to provide an improved semiconductor device.

A first aspect of this invention provides a semiconductor device comprising a semi-insulating substrate; a channel layer formed on the semi-insulating substrate; and an electron supply layer formed on the semi-insulating substrate for generating a two-dimensional electron gas, the electron supply layer including a doped superlattice layer, the superlattice layer including layers of $In_XAl_{1-X}As$ and layers of $In_YAl_{1-Y}As$ which alternate with each other, where $0 \leq X \leq 1.0$ and $0 \leq Y \leq 1.0$, and X differs from Y.

A second aspect of this invention is based on the first aspect thereof, and provides a semiconductor device wherein one of X and Y is equal to or smaller than 0.52, and the other of X and Y is equal to or greater than 0.52.

A third aspect of this invention is based on the first aspect thereof, and provides a semiconductor device wherein the layers of $In_XAl_{1-X}As$ and the layers of $In_YAl_{1-Y}As$ have thicknesses equal to or smaller than critical thicknesses to prevent dislocation from being caused by lattice mismatching.

A fourth aspect of this invention is based on the first aspect thereof, and provides a semiconductor device wherein one of X and Y is equal to 1, and the other of X and Y is equal to 0.

A fifth aspect of this invention is based on the fourth aspect thereof, and provides a semiconductor device wherein the layers of InAs and the layers of AlAs have thicknesses equal to or smaller than critical thicknesses to prevent dislocation from being caused by lattice mismatching.

A sixth aspect of this invention is based on the fourth aspect thereof, and provides a semiconductor device wherein the layers of InAs and the layers of AlAs have thicknesses each corresponding to two monolayers, and the layers of InAs and the layers of AlAs form about twenty periods of the alternation.

A seventh aspect of this invention is based on the first aspect thereof, and provides a semiconductor device wherein one of X and Y is equal to 0.8, and the other of X and Y is equal to 0.2.

An eighth aspect of this invention is based on the seventh aspect thereof, and provides a semiconductor device wherein the layers of $In_{0.8}Al_{0.2}As$ and the layers of $In_{0.2}Al_{0.8}As$ have thicknesses each equal to about 2 nm, and the layers of $In_{0.8}Al_{0.2}As$ and the layers of $In_{0.2}Al_{0.8}As$ form about five periods of the alternation.

A ninth aspect of this invention is based on the first aspect thereof, and provides a semiconductor device wherein ones of the layers of $In_XAl_{1-X}As$ and the layers of $In_YAl_{1-Y}As$ which relate to a greater of X and Y are doped, and the other ones of the layers of $In_XAl_{1-X}As$ and the layers of $In_YAl_{1-Y}As$ are non-doped.

A tenth aspect of this invention is based on the first aspect thereof, and provides a semiconductor device wherein the electron supply layer includes a δ-doped layer which enables impurities to be locally located.

An eleventh aspect of this invention is based on the first aspect thereof, and provides a semiconductor device further comprising a non-doped spacer layer of $In_ZAl_{1-Z}As$ located between the channel layer and the electron supply layer, where $0 \leq Z \leq 0.52$.

A twelfth aspect of this invention is based on the eleventh aspect thereof, and provides a semiconductor device wherein Z is equal to 0.52, and the spacer layer has a thickness of 5 nm.

A thirteenth aspect of this invention is based on the eleventh aspect thereof, and provides a semiconductor device wherein the channel layer is made of non-doped $In_TGa_{1-T}As$, where $0.53 \leq T \leq 1$, and wherein the channel layer is greater in electron affinity than the spacer layer.

A fourteenth aspect of this invention is based on the thirteenth aspect thereof, and provides a semiconductor device wherein the channel layer includes a layer of $In_{0.53}Ga_{0.47}As$ and a layer of $In_{0.8}Ga_{0.2}As$, the layer of $In_{0.53}Ga_{0.47}As$ being closer to the spacer layer and having a thickness of 4 nm, the layer of $In_{0.8}Ga_{0.2}As$ being in contact with the layer of $In_{0.53}Ga_{0.47}As$ and having a thickness of 16 nm.

A fifteenth aspect of this invention is based on the first aspect thereof, and provides a semiconductor device wherein the electron supply layer is located between the semi-insulating substrate and the channel layer.

A sixteenth aspect of this invention is based on the first aspect thereof, and provides a semiconductor device further comprising a doped layer of $In_{0.52}Al_{0.48}As$ which is located between the electron supply layer and the channel layer, the layer of $In_{0.52}Al_{0.48}As$ serving as an electron supply layer.

A seventeenth aspect of this invention is based on the first aspect thereof, and provides a semiconductor device wherein the semi-insulating substrate is made of InP.

An eighteenth aspect of this invention provides a semiconductor device comprising a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_XAl_{1-X}As$ and layers of $In_YGa_{1-Y}As$ which alternate with each other, where $0 \leq X \leq 1.0$ and $0 \leq Y \leq 1.0$.

A nineteenth aspect of this invention is based on the eighteenth aspect thereof, and provides a semiconductor device wherein the superlattice layer has a thickness in a predetermined range to prevent dislocation from being caused by lattice mismatching.

A twentieth aspect of this invention is based on the eighteenth aspect thereof, and provides a semiconductor device wherein X is equal to 0.52 and Y is equal to 0.53, and the layers of $In_XAl_{1-X}As$ are thicker than the layers of $In_YGa_{1-Y}As$.

A twenty-first aspect of this invention is based on the eighteenth aspect thereof, and provides a semiconductor device wherein the layers of $In_YGa_{1-Y}As$ are doped.

A twenty-second aspect of this invention provides a semiconductor device comprising a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_XAl_{1-X}As$ and layers of $Al_YGa_{1-Y}As$ which alternate with each other, where $0 \leq X \leq 1.0$ and $0 \leq Y \leq 1.0$.

A twenty-third aspect of this invention is based on the twenty-second aspect thereof, and provides a semiconductor device wherein the superlattice layer has a thickness in a predetermined range to prevent dislocation from being caused by lattice mismatching.

A twenty-fourth aspect of this invention is based on the twenty-second aspect thereof, and provides a semiconductor device wherein the layers of $Al_YGa_{1-Y}As$ are doped.

A twenty-fifth aspect of this invention is based on the twenty-second aspect thereof, and provides a semiconductor device wherein the layers of $In_XAl_{1-X}As$ are doped, and $X \leq 0.2$ or $X > 0.8$.

A twenty-sixth aspect of this invention provides a semiconductor device comprising a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_XGa_{1-X}As$ and layers of $Al_YGa_{1-Y}As$ which alternate with each other, where $0 \leq X \leq 1.0$ and $0 \leq Y \leq 1.0$.

A twenty-seventh aspect of this invention is based on the twenty-sixth aspect thereof, and provides a semiconductor device wherein the superlattice layer has a thickness in a predetermined range to prevent dislocation from being caused by lattice mismatching.

A twenty-eighth aspect of this invention is based on the twenty-sixth aspect thereof, and provides a semiconductor device wherein the layers of $In_XGa_{1-X}As$ are doped.

A twenty-ninth aspect of this invention provides a semiconductor device comprising a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_X(Al_YGa_{1-Y})_{1-X}As$ and layers of $In_Z(Al_WGa_{1-W})_{1-Z}As$ which alternate with each other, where $0 \leq X \leq 1.0$, $0 \leq Y \leq 1.0$, $0 \leq Z \leq 1.0$, and $0 \leq W > 1.0$.

A thirtieth aspect of this invention Is based on the twenty-ninth aspect thereof, and provides a semiconductor device wherein the superlattice layer has a thickness in a predetermined range to prevent dislocation from being caused by lattice mismatching.

A thirty-first aspect of this invention is based on the twenty-ninth aspect thereof, and provides a semiconductor device wherein a ratio of the number of Al atoms to the number of In atoms in at least ones of the layers of $In_X(Al_YGa_{1-Y})_{1-X}As$ and the layers of $In_Z(Al_WGa_{1-W})_{1-Z}As$ is equal to 20% or less, or 80% or more, and the ones of the layers of $In_X(Al_YGa_{1-Y})_{1-X}As$ and the layers of $In_Z(Al_WGa_{1-W})_{1-Z}As$ are doped.

A twenty-second aspect of this invention is based on the eighteenth aspect thereof, and provides a semiconductor device wherein the electron supply layer includes a δ-doped layer which enables impurities to be locally located.

A thirty-third aspect of this invention provides a semiconductor device comprising a semi-insulating substrate; a channel layer formed on the semi-insulating substrate; and an electron supply layer formed on the semi-insulating substrate for generating a two-dimensional electron gas, the electron supply layer including a first sub layer and a second sub layer, the first sub layer being made of a III–V-group compound containing As, the second sub layer being made of a III–V-group compound containing As, the first and second sub layers having different compositions respectively, the electron supply layer having a mean lattice constant close to the lattice constant of $In_{0.52}Al_{0.48}As$.

DESCRIPTION OF THE PREFERRED EMBODIMENTS

Prior-art semiconductor devices will be explained hereinafter for a better understanding of this invention.

Figure 1:
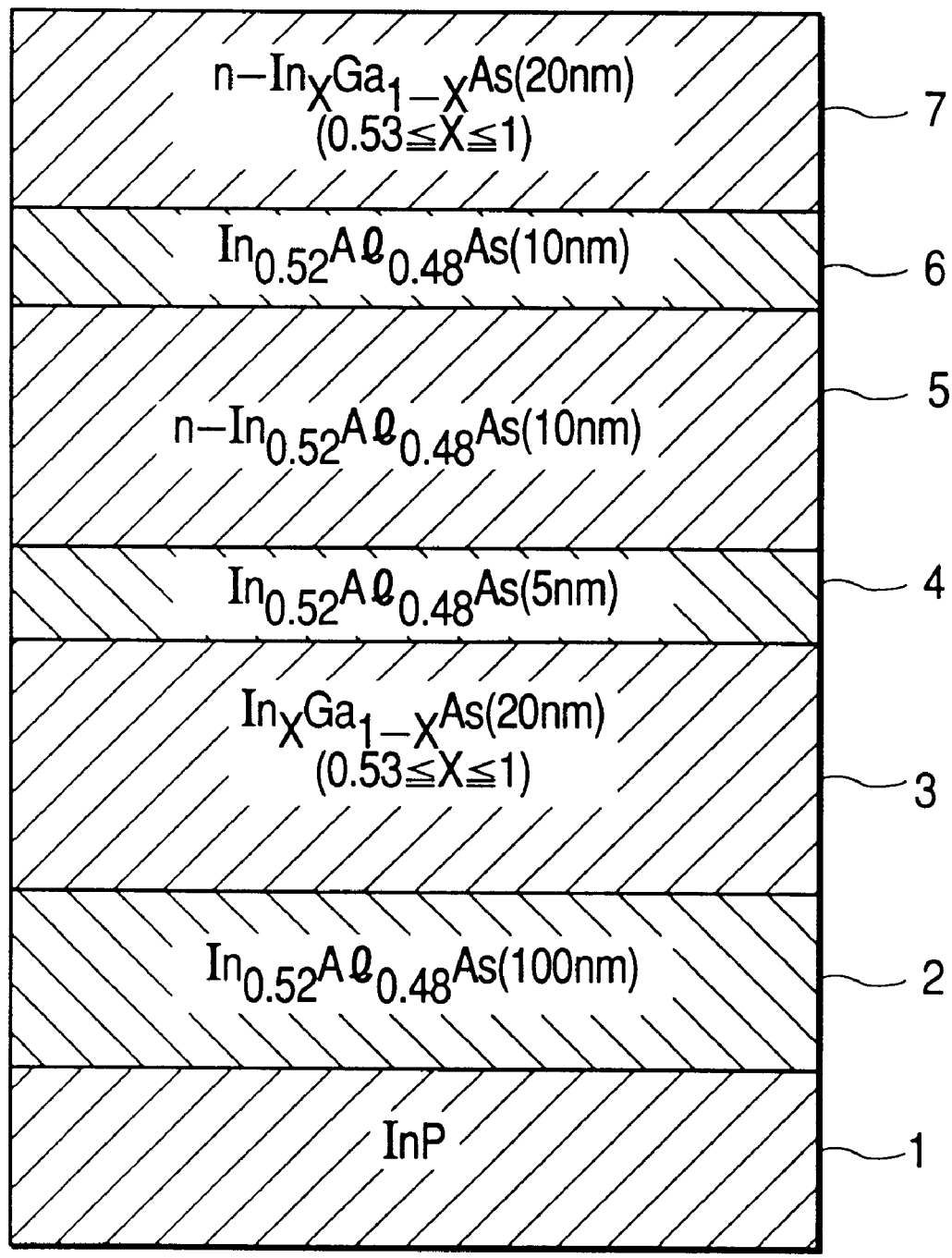
FIG. 1 is a diagrammatic section view of a first prior-art semiconductor device.

FIG. 1 shows a first prior-art semiconductor device including an InP (indium phosphide) substrate 1 on which an InAlAs (indium aluminum arsenic) layer and an an InGaAs (indium gallium arsenic) layer are successively superposed.

In the prior-art semiconductor device of FIG. 1, a buffer layer 2 made of a ternary mixed-crystal compound, $In_{0.52}Al_{0.48}As$, is formed on the InP substrate 1. The buffer layer 2 has a thickness of 100 nm. The buffer layer 2 blocks a current flow into the InP substrate 1 from an upper layer. A non-doped channel layer 3 made of $In_XGa_{1-X}As$ ($0.53 \leq X \leq 1$) is formed on the buffer layer 2. The channel layer 3 has a thickness of 20 nm. The channel layer 3 corresponds to a region in which a two-dimensional electron gas excited during operation of the device travels.

In the prior-art semiconductor device of FIG. 1, a non-doped spacer layer 4 made of $In_{0.52}Al_{0.48}As$ is formed on the channel layer 3. The spacer layer 4 has a thickness of 5 nm. A doped layer 5 is formed on the spacer layer 4. The doped layer 5 has a thickness of 10 nm. The doped layer 5 is made of Si-doped (silicon-doped) n-type $In_{0.52}Al_{0.48}As$. The doped layer 5 has a dopant concentration of about $1 \times 10^{19}$ $cm^{-3}$. To cause a two-dimensional electron gas in the channel layer 3, the electron affinity of the doped layer 5 is set smaller than that of the channel layer 3.

In the prior-art semiconductor device of FIG. 1, a non-doped gate contact layer 6 made of $In_{0.52}Al_{0.48}As$ is formed on the doped layer 5. The gate contact layer 6 has a thickness of 10 nm. The gate contact layer 6 is designed to provide Schottky contact with a gate electrode. A cap layer 7 is formed on the gate contact layer 6. The cap layer 7 has a thickness of 20 nm. The cap layer 7 is made of Si-doped n-type $In_XGa_{1-X}As$ ($0.53 \leq X \leq 1$). The cap layer 7 has a dopant concentration of about $1 \times 10^{19}$ $cm^{-3}$. The cap layer 7 is designed to provide good ohmic contact with a source electrode and a drain electrode.

A conceivable HEMT using the prior-art semiconductor device of FIG. 1 has a problem due to the use of n-type $In_{0.52}Al_{0.48}As$ in the doped layer 5. N. Hayafuji, Y. Yamamoto, N. Sonoda, S. Takamiya, and S. Mitsui have reported that the characteristics of an $In_{0.52}Al_{0.48}As$ layer (which has a composition equal to that of the doped layer 5) are changed by a heat treatment executed during a fabrication step or after a processing step (see "Thermal stability of AlInAs/GaInAs/InP heterostructures", Appl. Phys. Lett. 66(7)863, 1995). Thus, it is known that material of $In_{0.52}Al_{0.48}As$ is thermally unstable.

According to the report by N. Hayafuji, Y. Yamamoto, N. Sonoda, S. Takamiya, and S. Mitsui, it is confirmed that in a prior-art structure using an n-type $In_{0.52}Al_{0.48}As$ in a doped layer, fluorine diffuses into the n-type $In_{0.52}Al_{0.48}As$ layer during even a relatively-low-temperature heat treatment executed in a fabrication step or after a processing step. The diffusion of fluorine considerably decreases the degree of the emission of electrons from the doped layer 5 to the channel layer 3, and hence lowers the sheet carrier concentration in the prior-art semiconductor device of FIG. 1. As a result, the conceivable HEMT is poor in electric characteristics.

Generally, during the fabrication of a prior-art HEMT, a baking process related to a resist is implemented and an SiN passivation film is formed after the crystal growth of a semiconductor substrate. Therefore, a semiconductor device is frequently subjected to heat treatments (heating processes). As previously indicated, material of $In_{0.52}Al_{0.48}As$ is thermally unstable. Thus, the use of $In_{0.52}Al_{0.48}As$ in the doped layer 5 causes poor electric characteristics of the prior-art semiconductor device of FIG. 1.

It is assumed that a prior-art method of fabricating a HEMT is applied to a structure having a doped layer of $In_{0.52}Al_{0.48}As$. In this case, to prevent the characteristics of the structure from decreasing, it is necessary to execute a heat treatment (a thermal process) at a temperature in such a low range as to maintain the dopant concentration of the doped layer at a setting value. The execution of the heat treatment at a low temperature tends to be less reliable. Accordingly, it is difficult to fabricate a HEMT having desired electric characteristics.

A general test on a semiconductor device has a first step of holding the device in a high-temperature atmosphere for a given length of time, and a second step of measuring the electric characteristics of the device to estimate the reliability of the device after the first step. During such a reliability test, the characteristics of a prior-art HEMT are deteriorated by a high-temperature atmosphere. Thus, it is difficult that the prior-art HEMT stably maintains the desired characteristics after the reliability test.

There are prior-art proposals to remove such problems. Specifically, Japanese published unexamined patent application 7-183493 discloses a semiconductor device designed to prevent the occurrence of a deterioration in carrier concentration.

Figure 2:
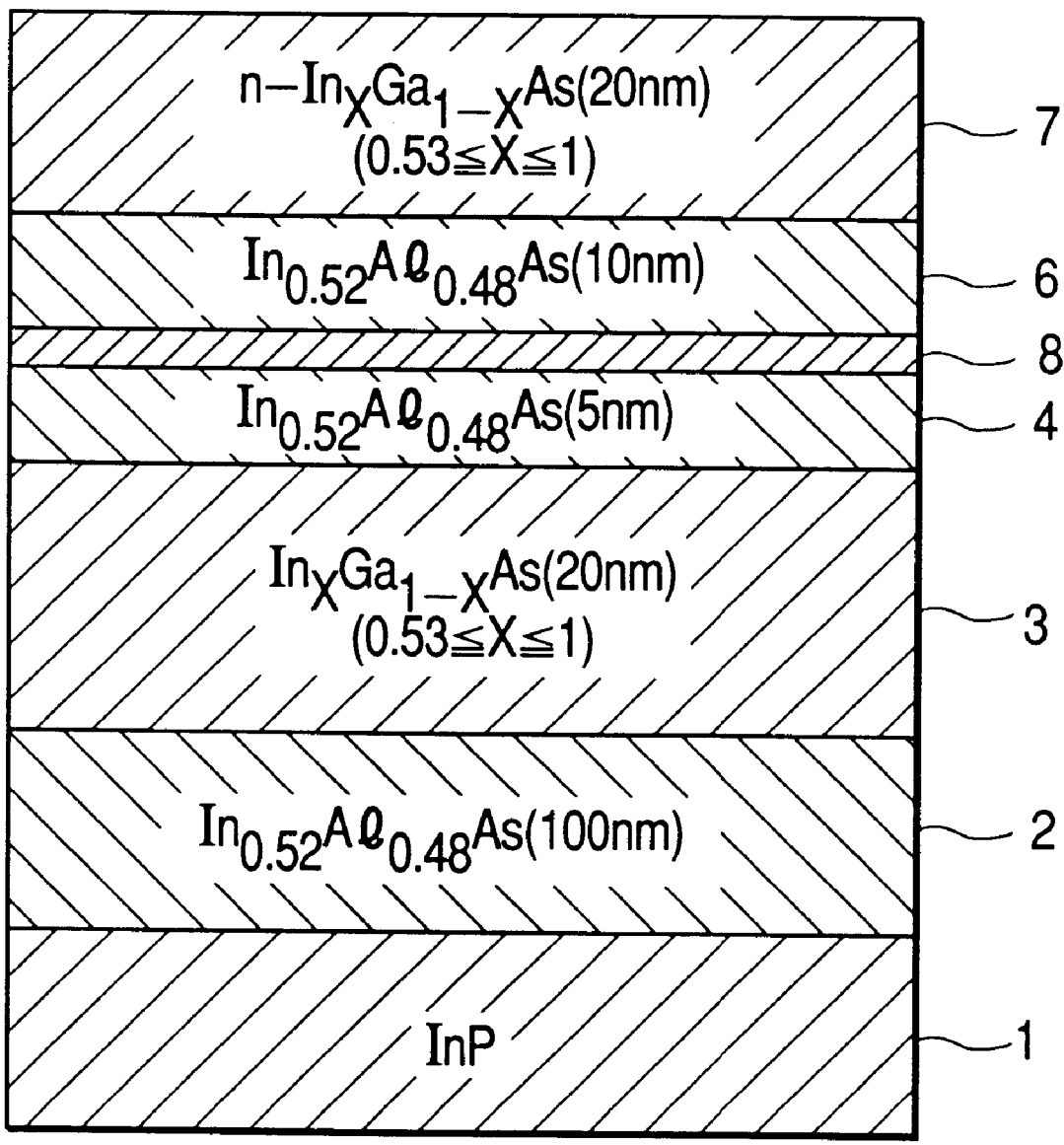
FIG. 2 is a diagrammatic section view of a second prior-art semiconductor device.

FIG. 2 shows a second prior-art semiconductor device disclosed in Japanese application 7-183493. The prior-art semiconductor device of FIG. 2 includes a doped layer 8 made of n-type $In_XGa_{1-X}As$. The doped layer 8 has a thickness of about 1 nm.

The doped layer 8 of $In_XGa_{1-X}As$ in the prior-art semiconductor device of FIG. 2 is thermally stabler than a doped layer of $In_{0.52}Al_{0.48}As$. Thus, the prior-art semiconductor device of FIG. 2 can provide a thermally-stable HEMT. Accordingly, the prior-art semiconductor device of FIG. 2 can provide a HEMT which is highly reliable in electric characteristics.

In the prior-art semiconductor device of FIG. 2, if the thickness of the $In_XGa_{1-X}As$ layer is increased to improve initial electric characteristics of the device, the thickness of the Schottky barrier in a gate contact layer decreases due to a low bandgap energy of the $In_XGa_{1-X}As$ layer. Therefore, in this case, it is expected that the backward-direction withstand voltage of a gate decreases. Thus, the $In_XGa_{1-X}As$ layer should not be thicker. Since it is necessary to use a very thin doped layer 8 of n-type $In_XGa_{1-X}As$ in this way, the HEMT provided by the prior-art semiconductor device of FIG. 2 is poor in initial characteristics.

Figure 3:
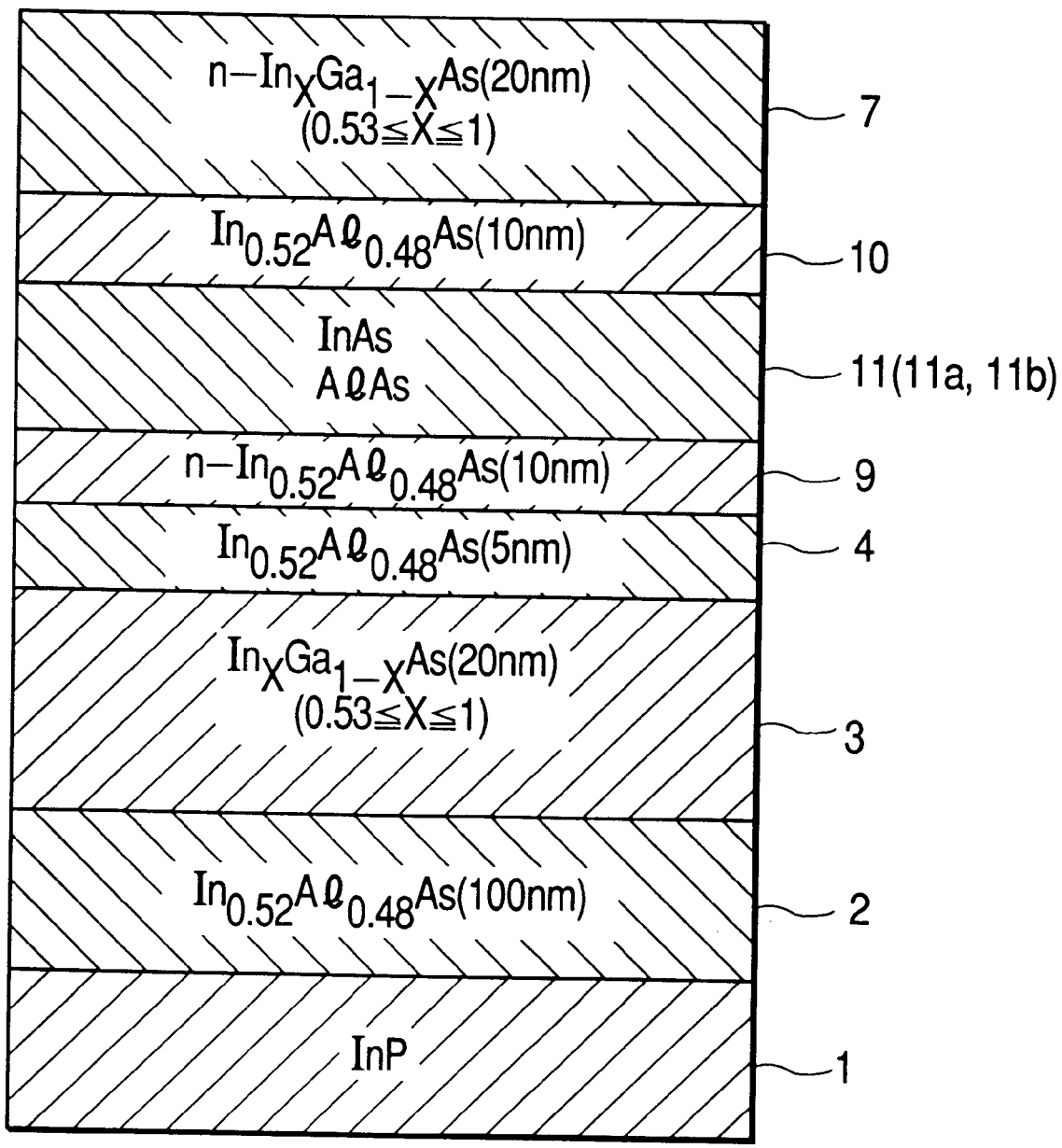
FIG. 3 is a diagrammatic section view of a prior-art heterojunction FET.

The manuscript of lectures related to the Japanese applied physics society, 28a-M-7, 1996 (by NEC), discloses a prior-art heterojunction FET having a structure shown in FIG. 3. The prior-art FET of FIG. 3 includes a doped layer 9 made of n-type $In_{0.52}Al_{0.48}As$, and a non-doped gate contact layer 10 made of $In_{0.52}Al_{0.48}As$. The prior-art FET of FIG. 3 also includes a superlattice layer 11 between the doped layer 9 and the gate contact layer 10. The superlattice layer 11 has a laminate of alternating sub-layers 11a and 11b of non-doped InAs and non-doped AlAs. The sub-layers 11a and 11b have thicknesses each corresponding to four molecules. The superlattice layer 11 has seven periods of the alternation.

In the prior-art FET of FIG. 3, the superlattice layer 11 blocks the entry of unwanted substance into the doped layer 9 from the gate contact layer 10. Thereby, it is possible to prevent the occurrence of a deterioration in dopant concentration which might be caused by the intrusion of unwanted substance.

In the prior-art FET of FIG. 3, the superlattice layer 11 extends between the doped layer 9 and the gate contact layer 10. Therefore, the distance between a channel layer 3 and a gate electrode is great. The great distance causes a smaller gain of the FET. Thus, the prior-art FET of FIG. 3 tends to be poor in electric characteristics.

Basic Embodiments

According to a first basic embodiment of this invention, a semiconductor device comprises a semi-insulating substrate; a channel layer formed on the semi-insulating substrate; and an electron supply layer formed on the semi-insulating substrate for generating a two-dimensional electron gas, the electron supply layer including a doped superlattice layer, the superlattice layer including layers of $In_XAl_{1-X}As$ and layers of $In_YAl_{1-Y}As$ which alternate with each other, where $0 \leq X \leq 1.0$ and $0 \leq Y \leq 1.0$, and X differs from Y.

In a semiconductor device of a second basic embodiment of this invention which is based on the first basic embodiment thereof, one of X and Y is equal to or smaller than 0.52, and the other of X and Y is equal to or greater than 0.52.

In a semiconductor device of a third basic embodiment of this invention which is based on the first basic embodiment thereof, the layers of $In_XAl_{1-X}As$ and the layers of $In_YAl_{1-Y}As$ have thicknesses equal to or smaller than critical thicknesses to prevent dislocation from being caused by lattice mismatching.

In a semiconductor device of a fourth basic embodiment of this invention which is based on the first basic embodiment thereof, one of X and Y is equal to 1, and the other of X and Y is equal to 0.

In a semiconductor device of a fifth basic embodiment of this invention which is based on the fourth basic embodiment thereof, the layers of InAs and the layers of AlAs have thicknesses equal to or smaller than critical thicknesses to prevent dislocation from being caused by lattice mismatching.

In a semiconductor device of a sixth basic embodiment of this invention which is based on the fourth basic embodiment thereof, the layers of InAs and the layers of AlAs have thicknesses each corresponding to two monolayers, and the layers of InAs and the layers of AlAs form about twenty periods of the alternation.

In a semiconductor device of a seventh basic embodiment of this invention which is based on the first basic embodiment thereof, one of X and Y is equal to 0.8, and the other of X and Y is equal to 0.2.

In a semiconductor device of an eighth basic embodiment of this invention which is based on the seventh basic embodiment thereof, the layers of $In_{0.8}Al_{0.2}As$ and the layers of $In_{0.2}Al_{0.8}As$ have thicknesses each equal to about 2 nm, and the layers of $In_{0.8}Al_{0.2}As$ and the layers of $In_{0.2}Al_{0.8}As$ form about five periods of the alternation.

In a semiconductor device of a ninth basic embodiment of this invention which is based on the first basic embodiment thereof, ones of the layers of $In_XAl_{1-X}As$ and the layers of $In_YAl_{1-Y}As$ which relate to a greater of X and Y are doped, and the other ones of the layers of $In_XAl_{1-X}As$ and the layers of $In_YAl_{1-Y}As$ are non-doped.

In a semiconductor device of a tenth basic embodiment of this invention which is based on the first basic embodiment thereof, the electron supply layer includes a δ-doped layer which enables impurities to be locally located.

A semiconductor device of an eleventh basic embodiment of this invention which is based on the first basic embodiment thereof further comprises a non-doped spacer layer of $In_ZAl_{1-Z}As$ located between the channel layer and the electron supply layer, where $0 \leq Z \leq 0.52$.

In a semiconductor device of a twelfth basic embodiment of this invention which is based on the eleventh basic embodiment thereof, Z is equal to 0.52, and the spacer layer has a thickness of 5 nm.

In a semiconductor device of a thirteenth basic embodiment of this invention which is based on the eleventh basic embodiment thereof, the channel layer is made of non-doped $In_TGa_{1-T}As$, where $0.53 \leq T \leq 1$, and wherein the channel layer is greater in electron affinity than the spacer layer.

In a semiconductor device of a fourteenth basic embodiment of this invention which is based on the thirteenth basic embodiment thereof, the channel layer includes a layer of $In_{0.53}Ga_{0.47}As$ and a layer of $In_{0.8}Ga_{0.2}As$, the layer of $In_{0.53}Ga_{0.47}As$ being closer to the spacer layer and having a thickness of 4 nm, the layer of $In_{0.8}Ga_{0.2}As$ being in contact with the layer of $In_{0.53}Ga_{0.47}As$ and having a thickness of 16 nm.

In a semiconductor device of a fifteenth basic embodiment of this invention which is based on the first basic embodiment thereof, the electron supply layer is located between the semi-insulating substrate and the channel layer.

A semiconductor device of a sixteenth basic embodiment of this invention which is based on the first basic embodiment thereof further comprises a doped layer of $In_{0.52}Al_{0.48}As$ which is located between the electron supply layer and the channel layer, the layer of $In_{0.52}Al_{0.48}As$ serving as an electron supply layer.

In a semiconductor device of a seventeenth basic embodiment of this invention which is based on the first basic embodiment thereof, the semi-insulating substrate is made of InP.

According to an eighteenth basic embodiment of this invention, a semiconductor device comprises a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_XAl_{1-X}As$ and layers of $In_YGa_{1-Y}As$ which alternate with each other, where $0 \leq X \leq 1.0$ and $0 \leq Y \leq 1.0$.

In a semiconductor device of a nineteenth basic embodiment of this invention which is based on the eighteenth basic embodiment thereof, the superlattice layer has a thickness in a predetermined range to prevent dislocation from being caused by lattice mismatching.

In a semiconductor device of a twentieth basic embodiment of this invention which is based on the eighteenth basic embodiment thereof, X is equal to 0.52 and Y is equal to 0.53, and the layers of $In_XAl_{1-X}As$ are thicker than the layers of $In_YGa_{1-Y}As$.

In a semiconductor device of a twenty-first basic embodiment of this invention which is based on the eighteenth basic embodiment thereof, the layers of $In_YGa_{1-Y}As$ are doped.

According to a twenty-second basic embodiment of this invention, a semiconductor device comprises a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_XAl_{1-X}As$ and layers of $Al_YGa_{1-Y}As$ which alternate with each other, where $0 \leq X \leq 1.0$ and $0 \leq Y \leq 1.0$.

In a semiconductor device of a twenty-third basic embodiment of this invention which is based on the twenty-second basic embodiment thereof, the superlattice layer has a thickness in a predetermined range to prevent dislocation from being caused by lattice mismatching.

In a semiconductor device of a twenty-fourth basic embodiment of this invention which is based on the twenty-second basic embodiment thereof, the layers of $Al_YGa_{1-Y}As$ are doped.

In a semiconductor device of a twenty-fifth basic embodiment of this invention which is based on the twenty-second basic embodiment thereof, the layers of $In_XAl_{1-X}As$ are doped, and $X \leq 0.2$ or $X \geq 0.8$.

According to a twenty-sixth basic embodiment of this invention, a semiconductor device comprises a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_XGa_{1-X}As$ and layers of $Al_YGa_{1-Y}As$ which alternate with each other, where $0 \leq X \leq 1.0$ and $0 \leq Y \leq 1.0$.

In a semiconductor device of a twenty-seventh basic embodiment of this invention which is based on the twenty-sixth basic embodiment thereof, the superlattice layer has a thickness in a predetermined range to prevent dislocation from being caused by lattice mismatching.

In a semiconductor device of a twenty-eighth basic embodiment of this invention which is based on the twenty-sixth basic embodiment thereof, the layers of $In_XGa_{1-X}As$ are doped.

According to a twenty-ninth basic embodiment of this invention, a semiconductor device comprises a semi-insulating substrate; a channel layer formed on the semi-insulating substrate; and an electron supply layer formed on the semi-insulating substrate for generating a two-dimensional electron gas, the electron supply layer including a superlattice layer, the superlattice layer including layers of $In_X(Al_YGa_{1-Y})_{1-X}As$ and layers of $In_Z(Al_WGa_{1-W})_{1-Z}As$ which alternate with each other, where $0 \leq X \leq 1.0$, $0 \leq Y \leq 1.0$, $0 \leq Z \leq 1.0$, and $0 \leq W \leq 1.0$.

In a semiconductor device of a thirtieth basic embodiment of this invention which is based on the twenty-ninth basic embodiment thereof, the superlattice layer has a thickness in a predetermined range to prevent dislocation from being caused by lattice mismatching.

In a semiconductor device of a thirty-first basic embodiment of this invention which is based on the twenty-ninth basic embodiment thereof, a ratio of the number of Al atoms to the number of In atoms in at least ones of the layers of $In_X(Al_YGa_{1-Y})_{1-X}As$ and the layers of $In_Z(Al_WGa_{1-W})_{1-Z}As$ is equal to 20% or less, or 80% or more, and the ones of the layers of $In_X(Al_YGa_{1-Y})_{1-X}As$ and the layers of $In_Z(Al_WGa_{1-W})_{1-Z}As$ are doped.

In a semiconductor device of a thirty-second basic embodiment of this invention which is based on the eighteenth basic embodiment thereof, the electron supply layer includes a δ-doped layer which enables impurities to be locally located.

According to a thirty-third basic embodiment of this invention, a semiconductor device comprises a semi-insulating substrate; a channel layer formed on the semi-insulating substrate; and an electron supply layer formed on the semi-insulating substrate for generating a two-dimensional electron gas, the electron supply layer including a first sub layer and a second sub layer, the first sub layer being made of a III–V-group compound containing As, the second sub layer being made of a III–V-group compound containing As, the first and second sub layers having different compositions respectively, the electron supply layer having a mean lattice constant close to the lattice constant of $In_{0.52}Al_{0.48}As$.

First Embodiment

Figure 4:
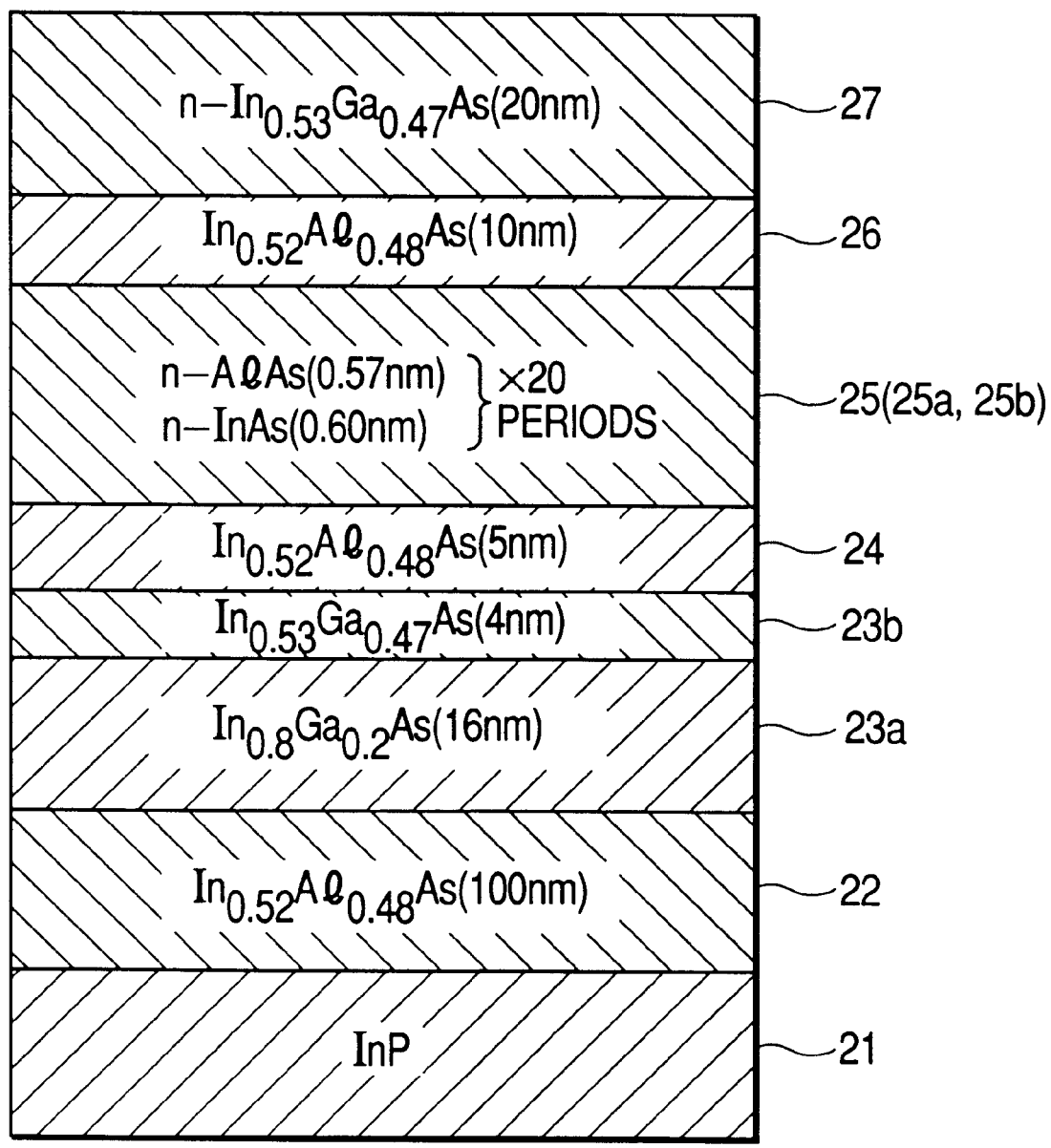
FIG. 4 is a diagrammatic section view of a semiconductor structure according to a first embodiment of this invention.

With reference to FIG. 4, a semiconductor structure includes a semi-insulating substrate 21 which is made of InP (indium phosphide). A buffer layer 22 is formed on the InP substrate 21. The buffer layer 22 is made of non-doped $In_{0.52}Al_{0.48}As$. The buffer layer 22 has a thickness of 100 nm.

A first channel layer 23a is formed on the buffer layer 22. The first channel layer 23a is made of non-doped $In_{0.8}Ga_{0.2}As$. The first channel layer 23a has a thickness of 16 nm. A second channel layer 23b is formed on the first channel layer 23a. The second channel layer 23b is made of non-doped $In_{0.53}Ga_{0.47}As$. The second channel layer 23b has a thickness of 4 nm. The second channel layer 23b serves as an electron distribution control layer. A spacer layer 24 is formed on the second channel layer 23b. The spacer layer 24 is made of non-doped $In_{0.52}Al_{0.48}As$. The spacer layer 24 has a thickness of 5 nm.

A doped superlattice layer 25 is formed on the spacer layer 24. The doped superlattice layer 25 serves as an electron supply layer. The doped superlattice layer 25 is composed of Si-doped n-type InAs layers 25a and Si-doped n-type AlAs layers 25b which alternate with each other in a laminate. The doped superlattice layer 25 has twenty periods of the alternation. In other words, the doped superlattice layer 25 has an alternating structure of twenty Si-doped n-type InAs layers 25a and twenty Si-doped n-type AlAs layers 25b. Each of the InAs layers 25a has a thickness of 0.6 nm which corresponds to two monolayers. Each of the InAs layers 25a has a dopant concentration of $1 \times 10^{19}$ cm$^{-3}$.

Each of the AlAs layers 25b has a thickness of 0.57 nm which corresponds to two monolayers. Each of the AlAs layers 25b has a dopant concentration of $2\times10^{18}$ cm$^{-3}$.

A gate contact layer 26 is formed on the doped superlattice layer 25. The gate contact layer 26 is made of non-doped $In_{0.52}Al_{0.48}As$. The gate contact layer 26 has a thickness of 10 nm. A cap layer 27 is formed on the gate contact layer 26. The cap layer 27 is made of Si-doped n-type $In_{0.53}Al_{0.47}As$. The cap layer 27 has a dopant concentration of $1\times10^{19}$ cm$^{-3}$. The cap layer 27 has a thickness of 20 nm.

Figure 5:
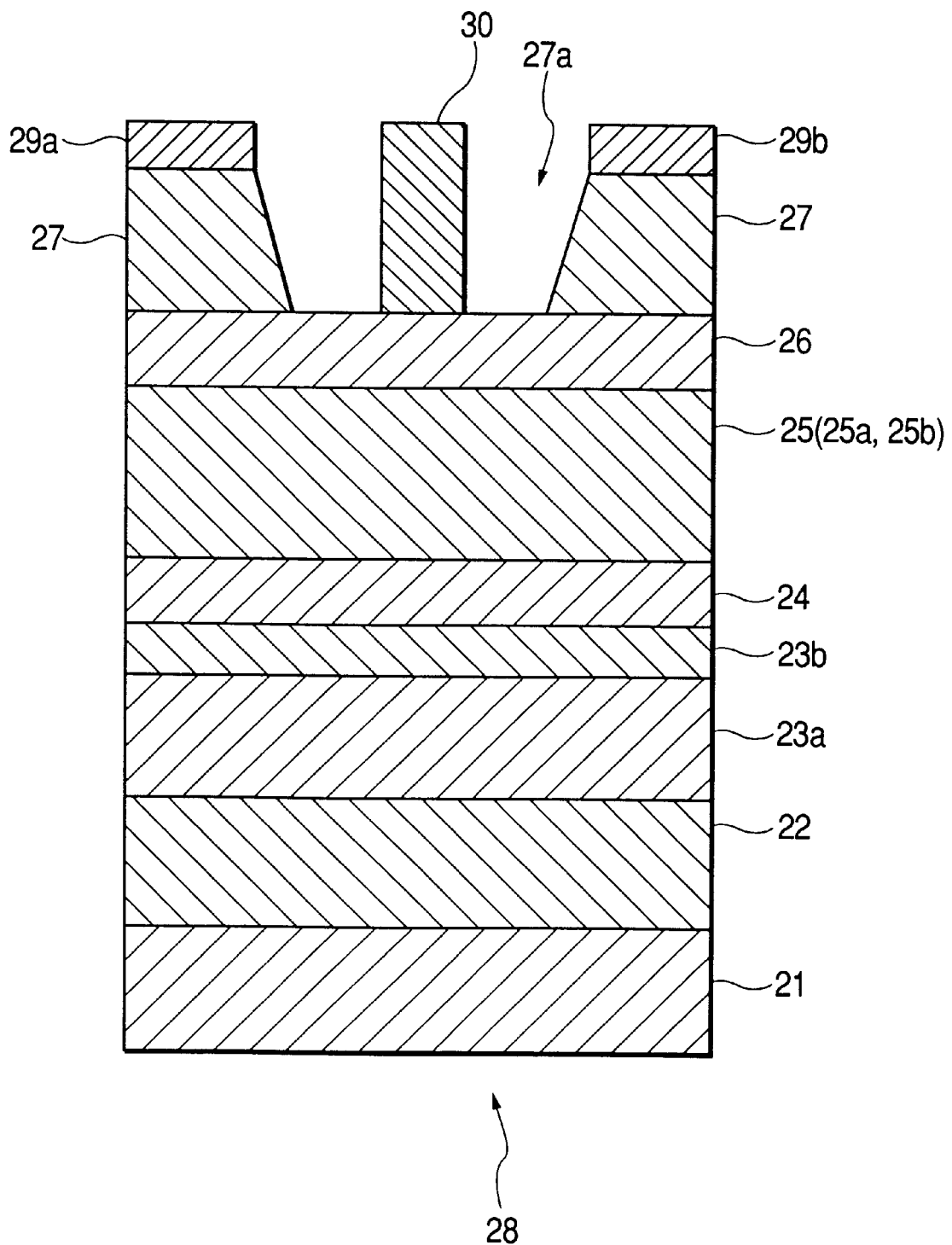
FIG. 5 is a diagrammatic section view of a HEMT in the first embodiment of this invention.

The semiconductor structure of FIG. 4 is processed into a high electron mobility transistor (HEMT) 28 which is shown in FIG. 5. The HEMT 28 of FIG. 5 includes ohmic electrodes serving as a source electrode 29a and a drain electrode 29b respectively. The source electrode 29a and the drain electrode 29b are formed on the cap layer 27. The source electrode 29a is in ohmic contact with the cap layer 27. The drain electrode 29b is in ohmic contact with the cap layer 27.

In the HEMT 28 of FIG. 5, the cap layer 27 has a recess 27a which is formed by a selective etching process. The gate contact layer 26 is exposed at the bottom of the recess 27a. A gate electrode 30 is formed or provided in the recess 27a. The gate electrode 30 extends on the gate contact layer 26. The gate electrode 30 is in Schottky contact with the gate contact layer 26.

The doped superlattice layer 25 provides improved characteristics of the HEMT 28 of FIG. 5 and the semiconductor structure of FIG. 4 as will be indicated hereinafter.

Experiments were carried out on a layer of doped n-type InAs, a layer of doped n-type $In_{0.61}Al_{0.39}As$, a layer of doped n-type $In_{0.52}Al_{0.48}As$, a layer of doped n-type $In_{0.19}Al_{0.81}As$, and a layer of doped n-type AlAs. During the experiments, the layer of InAs, the layer of $In_{0.61}Al_{0.39}As$, the layer of $In_{0.52}Al_{0.48}As$, the layer of $In_{0.19}Al_{0.81}As$, and the layer of AlAs were subjected to a heating process (a heat treatment). Specifically, the layer of InAs, the layer of $In_{0.61}Al_{0.39}As$, the layer of $In_{0.52}Al_{0.48}As$, the layer of $In_{0.19}Al_{0.81}As$, and the layer of AlAs were held in a nitrogen ($N_2$) atmosphere at 360° C. for two minutes. Regarding each of the layer of InAs, the layer of $In_{0.61}Al_{0.39}As$, the layer of $In_{0.52}Al_{0.48}As$, the layer of $In_{0.19}Al_{0.81}As$, and the layer of AlAs, measurements were made as to the dopant concentration which occurred before the heating process and the dopant concentration which occurred after the heating process. Regarding each of the layer of InAs, the layer of $In_{0.61}Al_{0.39}As$, the layer of $In_{0.52}Al_{0.4}As$, the layer of $In_{0.19}Al_{0.81}As$, and the layer of AlAs, calculation was given of the ratio between the dopant concentration measured before the heating process and the dopant concentration measured after the heating process.

Figure 6:
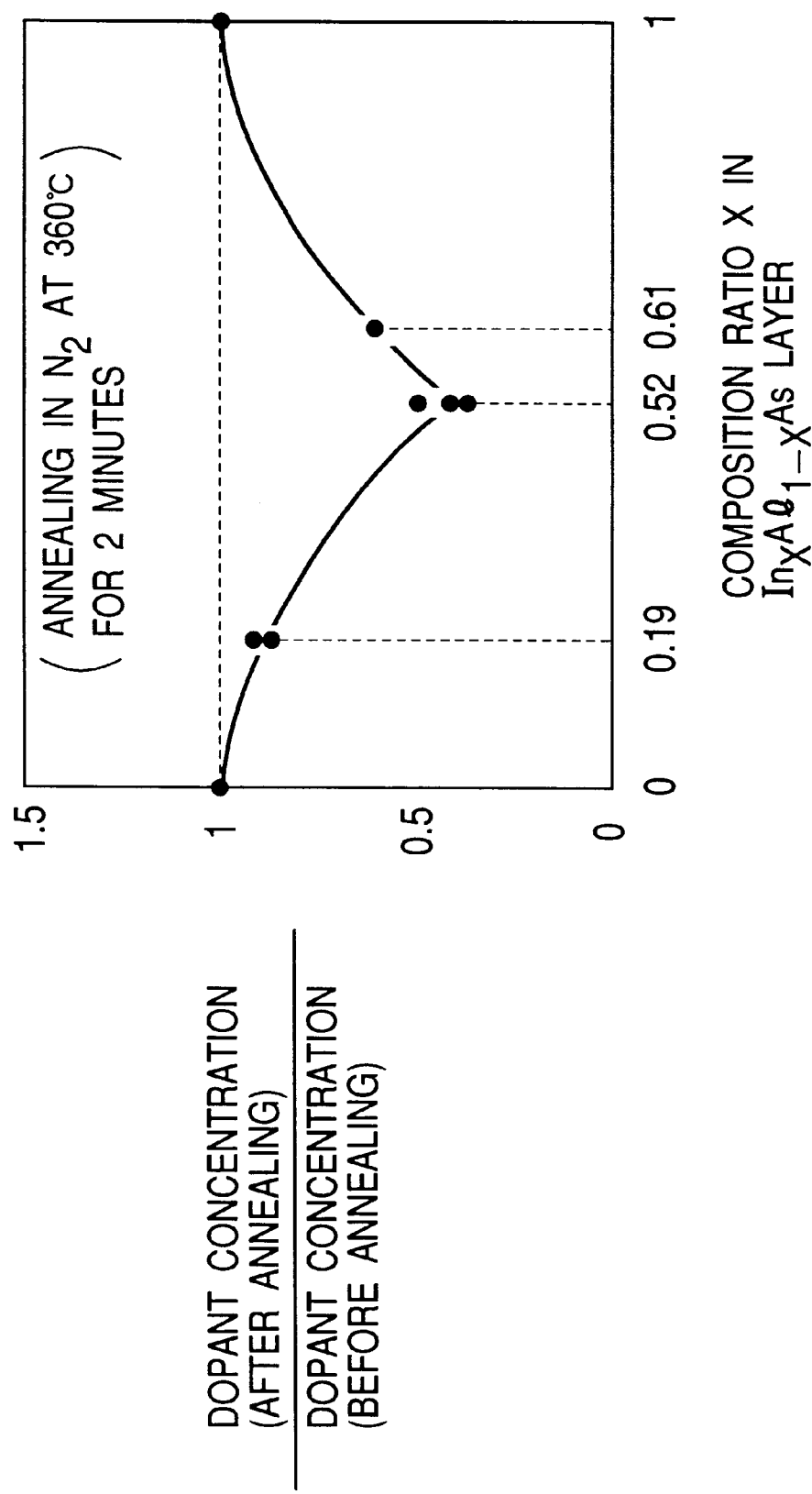
FIG. 6 is a diagram of the relation between the atomic fraction (the composition ratio) "X" and the ratio between the dopant concentrations in an $In_XAl_{1-X}As$ layer which occur before and after a heat treatment.

FIG. 6 shows the calculated ratios between the dopant concentrations in the layer of InAs, the layer of $In_{0.61}Al_{0.39}As$, the layer of $In_{0.52}Al_{0.48}As$, the layer of $In_{0.19}Al_{0.81}As$, and the layer of AlAs. With reference to FIG. 6, it was found that the heating-process-based deteriorations in carrier concentration of the layer of InAs, the layer of $In_{0.61}Al_{0.39}As$, the layer of $In_{0.19}Al_{0.81}As$, and the layer of AlAs were smaller than that of the layer of $In_{0.52}Al_{0.48}As$. In addition, it was found that the heating-process-based deteriorations in carrier concentration of the layer of InAs and the layer of AlAs were very small.

Figure 7:
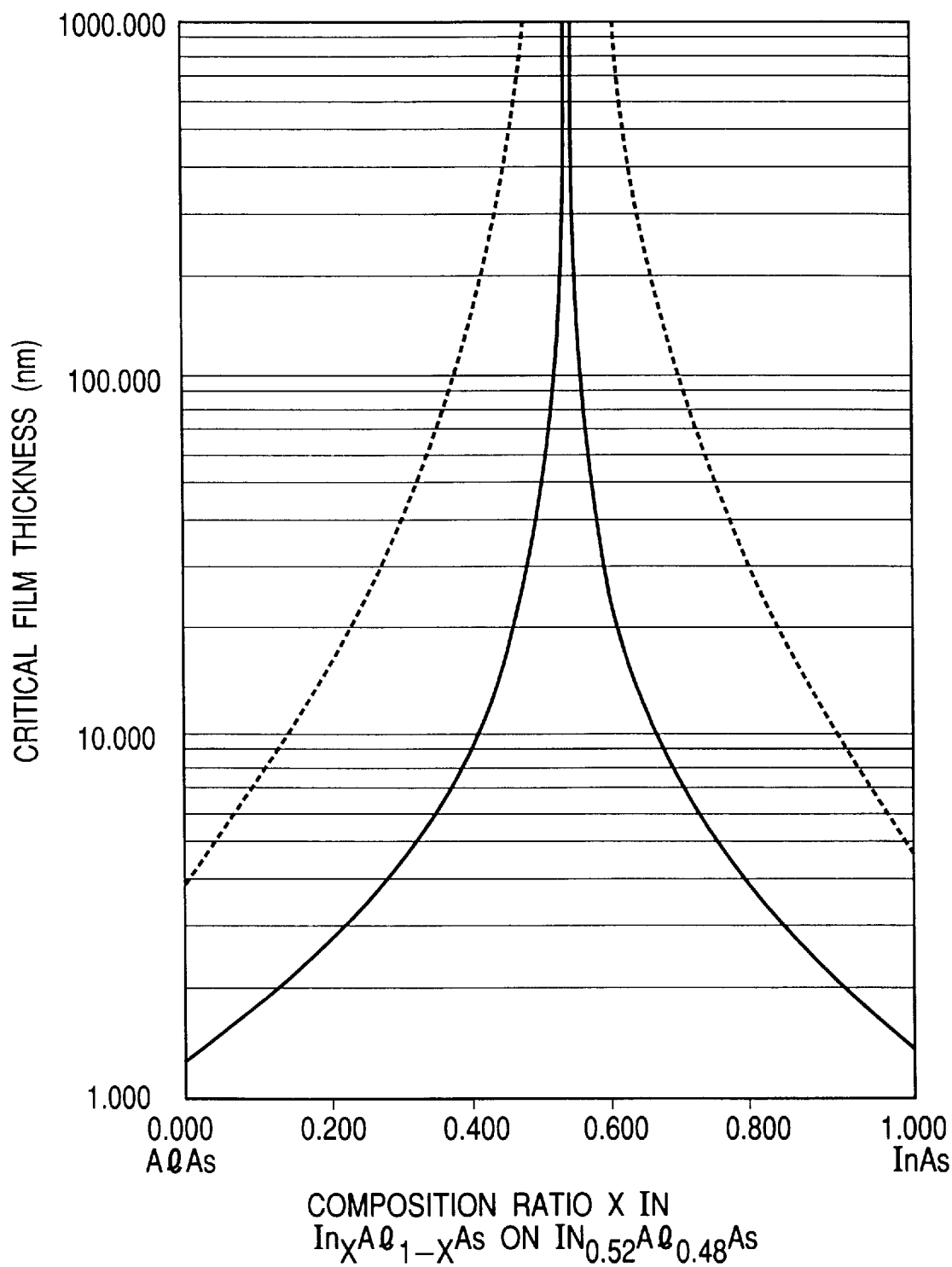
FIG. 7 is a diagram of the relation between the atomic fraction (the composition ratio) "X" and the critical film thickness to which a crystal of $In_XAl_{1-X}As$ can grow on an InP substrate without dislocation.

FIG. 7 shows the results of calculation of the maximum film thickness (the critical film thickness) to which a crystal of $In_XAl_{1-X}As$ can grow without dislocation while the atomic fraction (the composition ratio) "X" varies from "0" to "1.0". This calculation is based on equations by Matthews and People. The lattice constant of an InP crystal is equal to 5.8688 angstroms (0.58688 nm). The lattice constant of an InAs crystal is equal to 6.0584 angstroms (0.60584 nm). The lattice constant of an AlAs crystal is equal to 5.6611 angstroms (0.56611 nm). Thus, the lattice constant of the InAs crystal and the lattice constant of the AlAs crystal differ from that of the InP crystal by about +4% and –4% respectively.

Figure 8:
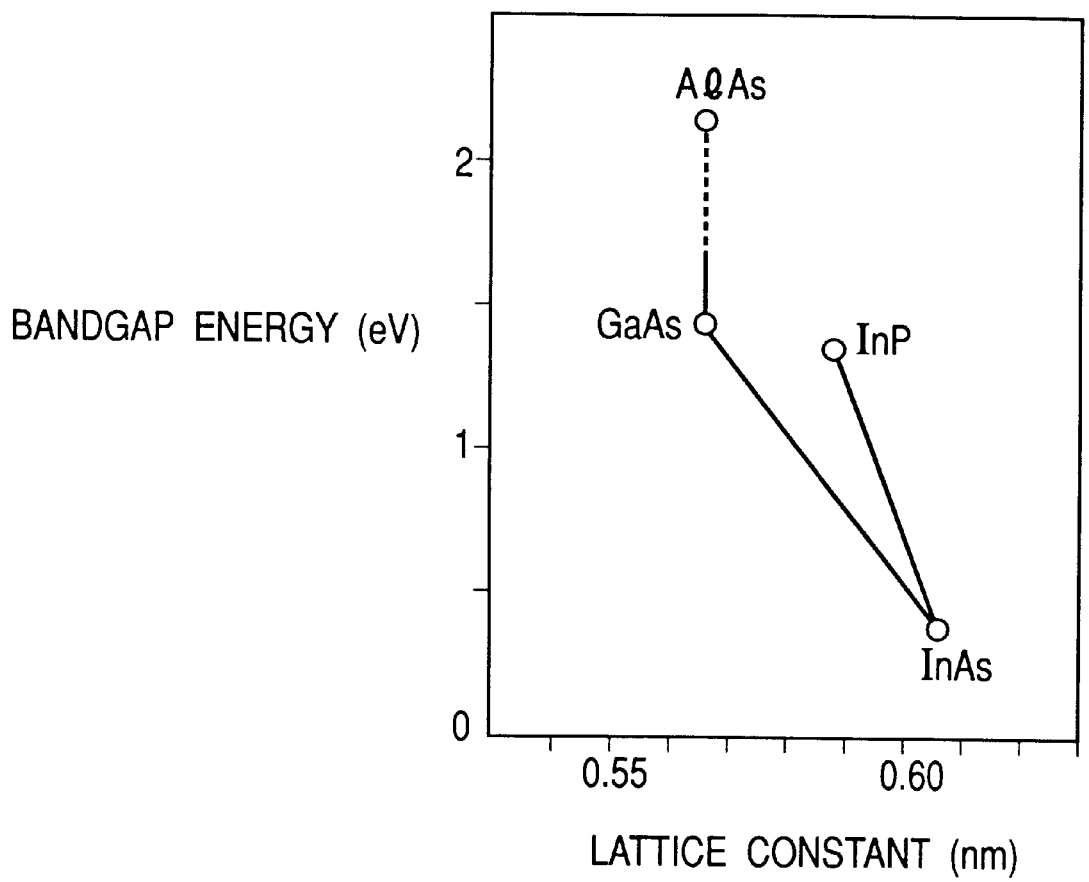
FIG. 8 is a diagram of the bandgap energies and the lattice constants of an InP crystal, an InAs crystal, a GaAs crystal, and an AlAs crystal.

FIG. 8 shows the lattice constant and the bandgap energy of each of an InP crystal, an InAs crystal, an AlAs crystal, and a GaAs crystal. With reference to FIG. 8, the point corresponding to the InAs crystal and the point corresponding to the AlAs crystal are separate from the point corresponding to the InP crystal by approximately equal distances in opposite directions respectively. In other words, the lattice constant of the InAs crystal and the lattice constant of the AlAs crystal differ from that of the InP crystal by approximately equal values having opposite signs respectively. Furthermore, the bandgap energy of the InAs crystal and the bandgap energy of the AlAs crystal differ from that of the InP crystal by approximately equal levels having opposite signs respectively.

It is understood from FIGS. 7 and 8 that only a very thin layer of an In-rich $In_XAl_{1-X}As$ crystal or an Al-rich $In_XAl_{1-X}As$ crystal free from dislocation can grow on a layer lattice-matching with an InP substrate since the lattice constant of the In-rich $In_XAl_{1-X}As$ crystal or the Al-rich $In_XAl_{1-X}As$ crystal significantly differs from that of a crystal in the InP substrate.

Generally, as the degree of lattice mismatching increases, a technique for growing a crystal is more difficult since the allowable range of conditions of crystal growth is narrower. As previously indicated, the semiconductor structure of FIG. 4 (the HEMT of FIG. 5) uses the doped superlattice layer 25. The doped superlattice layer 25 is composed of Si-doped n-type InAs layers 25a and Si-doped n-type AlAs layers 25b which alternate with each other in a laminate. The superlattice doped layer 25 has twenty periods of the alternation. Each of the InAs layers 25a has a thickness of 0.6 nm which corresponds to two monolayers. Each of the AlAs layers 25b has a thickness of 0.57 nm which corresponds to two monolayers. The doped superlattice layer 25 enables a highly thermal stability of the semiconductor structure of FIG. 4 (the HEMT of FIG. 5).

In the doped superlattice layer 25, the InAs layers 25a and the AlAs layers 25b alternate with each other in a laminate. The composition of the InAs layers 25a and the composition of the AlAs layers 25b are symmetrical with respect to the composition of an $In_{0.5}Al_{0.5}As$ crystal. Accordingly, the mean composition (the average composition) of the doped superlattice layer 25 is close to the composition of the $In_{0.52}Al_{0.48}As$ layer 24 which is substantially equal in lattice constant to the InP substrate 21.

Figure 19:
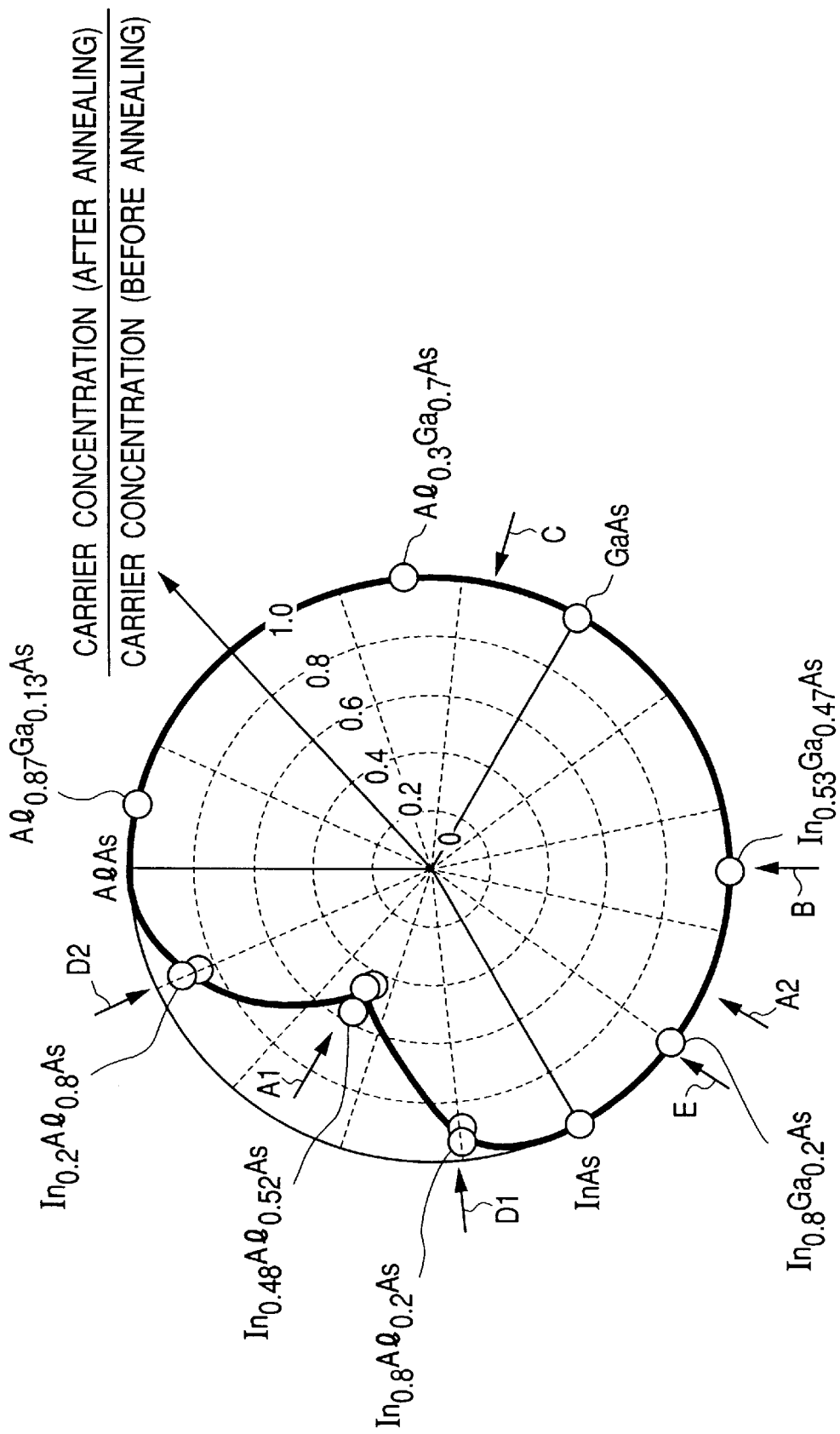
FIG. 19 is a diagram of the ratios between the dopant concentrations in an InAs crystal, a GaAs crystal, an AlAs layer, and related ternary mixed-crystals which occur before and after a heat treatment.

In view of a possible affection by a heat treatment (a heating process) which is shown in FIG. 19 explained later, the InAs layers 25a may be replaced by $In_XAl_{1-X}As$ (1.0>X>0.8) layers while the AlAs layers 25b may be replaced by $In_{1-Y}Al_YAs$ (0.8≦Y≦1.0) layers.

Second Embodiment

Figure 9:
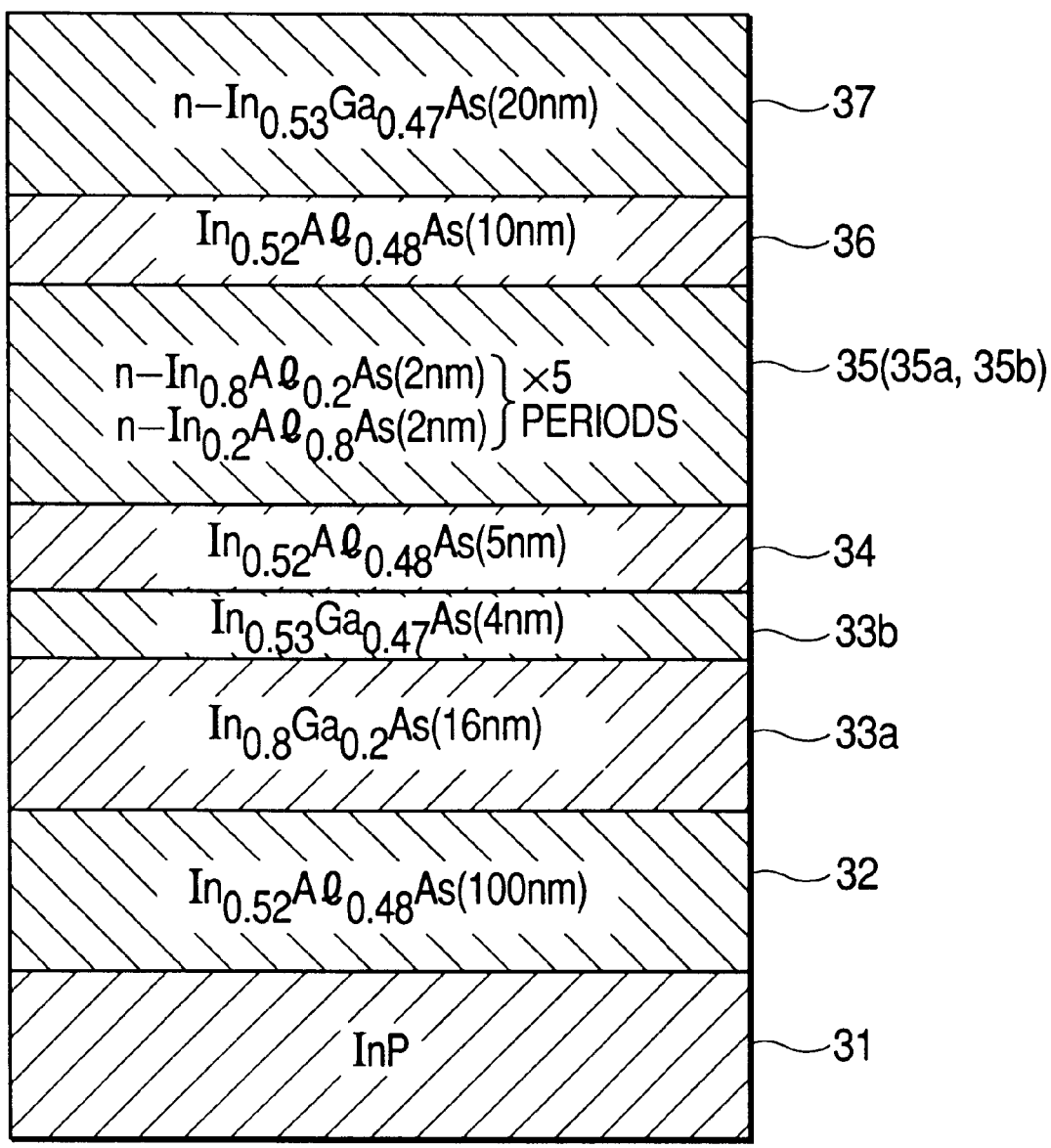
FIG. 9 is a diagrammatic section view of a semiconductor structure according to a second embodiment of this invention.

With reference to FIG. 9, a semiconductor structure includes a semi-insulating substrate 31 which is made of InP (indium phosphide). A buffer layer 32 is formed on the InP substrate 31. The buffer layer 32 is made of non-doped $In_{0.52}Al_{0.48}As$. The buffer layer 32 has a thickness of 100 nm.

A first channel layer 33a is formed on the buffer layer 32. The first channel layer 33a is made of non-doped $In_{0.8}Ga_{0.2}As$. The first channel layer 33a has a thickness of 16 nm. A second channel layer 33b is formed on the first channel layer 33a. The second channel layer 33b is made of non-doped $In_{0.53}Ga_{0.47}As$. The second channel layer 33b has a thickness of 4 nm. The second channel layer 33b serves as an electron distribution control layer. A spacer layer 34 is formed on the second channel layer 33b. The spacer layer 34 is made of non-doped $In_{0.52}Al_{0.48}As$. The spacer layer 34 has a thickness of 5 nm.

A doped superlattice layer 35 is formed on the spacer layer 34. The doped superlattice layer 35 serves as an electron supply layer. The doped superlattice layer 35 is composed of Si-doped n-type $In_{0.8}Al_{0.2}As$ layers 35a and Si-doped n-type $In_{0.2}Al_{0.8}As$ layers 35b which alternate with each other in a laminate. The doped superlattice layer 35 has five periods of the alternation. In other words, the doped superlattice layer 35 has an alternating structure of five Si-doped n-type $In_{0.8}Al_{0.2}As$ layers 35a and five Si-doped n-type $In_{0.2}Al_{0.8}As$ layers 35b. Each of the $In_{0.8}Al_{0.2}As$ layers 35a has a thickness of 2 nm. Each of the $In_{0.8}Al_{0.2}As$ layers 35a has a dopant concentration of $1\times10^{19}$ cm$^{-3}$. Each of the $In_{0.2}Al_{0.8}As$ layers 35b has a thickness of 2 nm. Each of the $In_{0.2}Al_{0.8}As$ layers 35b has a dopant concentration of $3\times10^{18}$ cm$^{-3}$.

A gate contact layer 36 is formed on the doped superlattice layer 35. The gate contact layer 36 is made of non-doped $In_{0.52}Al_{0.4}As$. The gate contact layer 36 has a thickness of 10 nm. A cap layer 37 is formed on the gate contact layer 36. The cap layer 37 is made of Si-doped n-type $In_{0.53}Al_{0.47}As$. The cap layer 37 has a dopant concentration of $1\times10^{19}$ cm$^{-3}$. The cap layer 37 has a thickness of 20 nm.

The semiconductor structure of FIG. 9 is processed into a high electron mobility transistor (HEMT). As previously indicated, the semiconductor structure of FIG. 9 uses the doped superlattice layer 35. The doped superlattice layer 35 is composed of Si-doped n-type $In_{0.8}Al_{0.2}As$ layers 35a and Si-doped n-type $In_{0.2}Al_{0.8}As$ layers 35b which alternate with each other in a laminate. The doped superlattice layer 35 has five periods of the alternation. Each of the $In_{0.8}Al_{0.2}As$ layers 35a has a thickness of 2 nm. Each of the $In_{0.2}Al_{0.8}As$ layers 35b has a thickness of 2 nm.

The degrees of lattice mismatching of an $In_{0.8}Al_{0.2}As$ crystal and an $In_{0.2}Al_{0.8}As$ crystal with an InP crystal are smaller than those of an InAs crystal and an AlAs crystal. Thus, it is easier to provide a thick doped superlattice layer 35. In addition, it is possible to provide a wider allowable range of conditions of crystal growth. As a result, the semiconductor structure of FIG. 9 is good in yield. In addition, the doped superlattice layer 35 enables a highly thermal stability of the semiconductor structure of FIG. 9.

In the doped superlattice layer 35, the $In_{0.8}Al_{0.2}As$ layers 35a and the $In_{0.2}Al_{0.8}As$ layers 35b alternate with each other in a laminate. The composition of the $In_{0.8}Al_{0.2}As$ layers 35a and the composition of the $In_{0.2}Al_{0.8}As$ layers 35b are symmetrical with respect to the composition of an $In_{0.5}Al_{0.5}As$ crystal. Accordingly, the mean composition (the average composition) of the doped superlattice layer 35 is close to the composition of the $In_{0.52}Al_{0.48}As$ layer 34 which is substantially equal in lattice constant to the InP substrate 31.

In view of a possible affection by a heat treatment (a heating process) which is shown in FIG. 19 explained later, the $In_{0.8}Al_{0.2}As$ layers 35a may be replaced by $In_XAl_{1-X}As$ ($1.0 \geq X > 0.8$) layers while the $In_{0.2}Al_{0.8}As$ layers 35b may be replaced by $In_{1-Y}Al_YAs$ ($0.8 < Y \leq 1.0$) layers.

Third Embodiment

Figure 10:
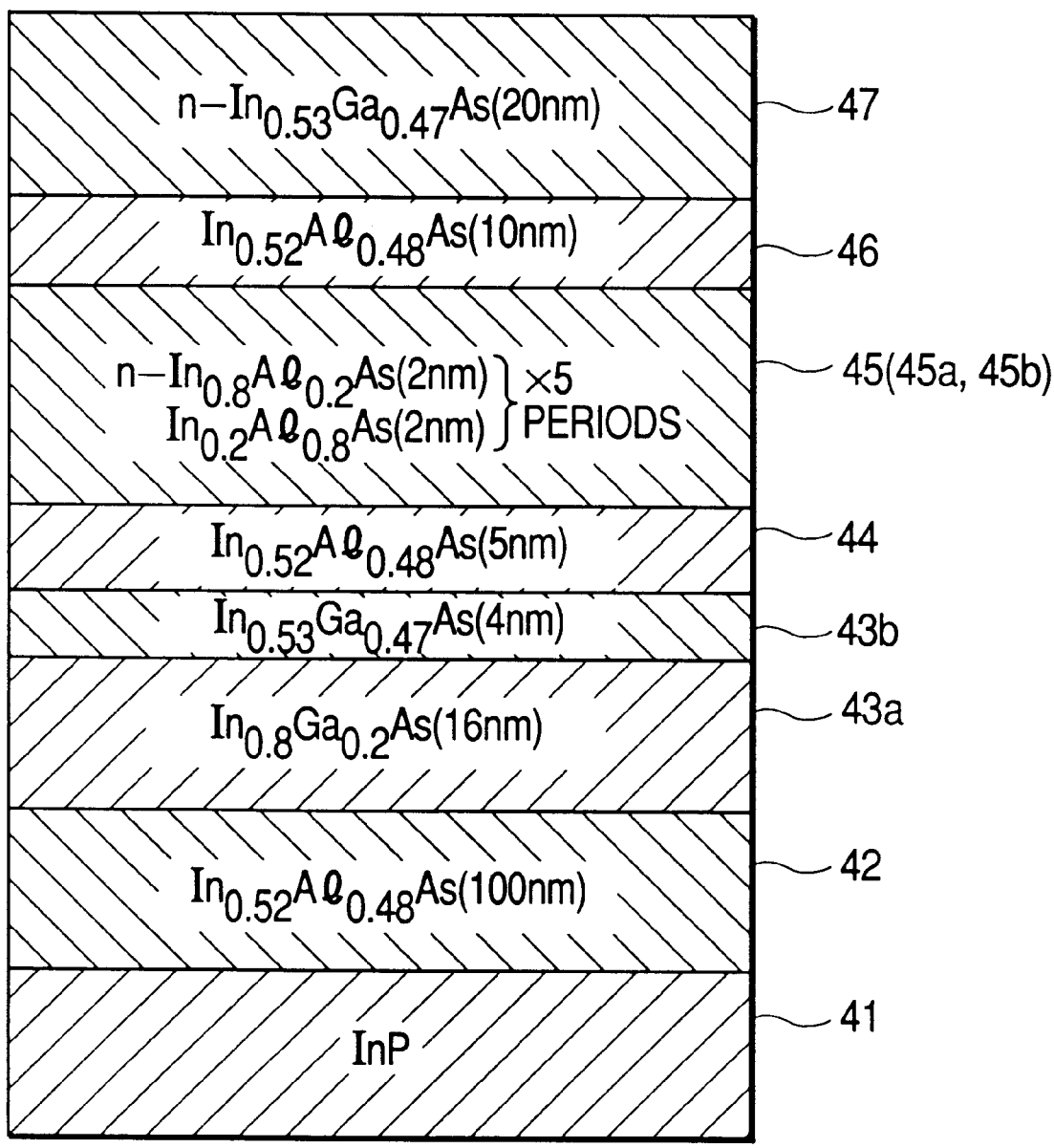
FIG. 10 is a diagrammatic section view of a semiconductor structure according to a third embodiment of this invention.

With reference to FIG. 10, a semiconductor structure includes a semi-insulating substrate 41 which is made of InP (indium phosphide). A buffer layer 42 is formed on the InP substrate 41. The buffer layer 42 is made of non-doped $In_{0.52}Al_{0.48}As$. The buffer layer 42 has a thickness of 100 nm.

A first channel layer 43a is formed on the buffer layer 42. The first channel layer 43a is made of non-doped $In_{0.8}Ga_{0.2}As$. The first channel layer 43a has a thickness of 16 nm. A second channel layer 43b is formed on the first channel layer 43a. The second channel layer 43b is made of non-doped $In_{0.53}Ga_{0.47}As$. The second channel layer 43b has a thickness of 4 nm. The second channel layer 43b serves as an electron distribution control layer. A spacer layer 44 is formed on the second channel layer 43b. The spacer layer 44 is made of non-doped $In_{0.52}Al_{0.48}As$. The spacer layer 44 has a thickness of 5 nm.

A doped superlattice layer 45 is formed on the spacer layer 44. The doped superlattice layer 45 serves as an electron supply layer. The doped superlattice layer 45 is composed of Si-doped n-type $In_{0.8}Al_{0.2}As$ layers 45a and non-doped $In_{0.2}Al_{0.8}As$ layers 45b which alternate with each other in a laminate. The doped superlattice layer 45 has five periods of the alternation. In other words, the doped superlattice layer 45 has an alternating structure of five Si-doped n-type $In_{0.8}Al_{0.2}As$ layers 45a and five non-doped $In_{0.2}Al_{0.8}As$ layers 45b. Each of the $In_{0.8}Al_{0.2}As$ layers 45a has a thickness of 2 nm. Each of the $In_{0.8}Al_{0.2}As$ layers 45a has a dopant concentration of $1\times10^{19}$ cm$^{-3}$. Each of the $In_{0.2}Al_{0.8}As$ layers 45b has a thickness of 2 nm.

A gate contact layer 46 is formed on the doped superlattice layer 45. The gate contact layer 46 is made of non-doped $In_{0.52}Al_{0.48}As$. The gate contact layer 46 has a thickness of 10 nm. A cap layer 47 is formed on the gate contact layer 46. The cap layer 47 is made of Si-doped n-type $In_{0.53}Al_{0.47}As$. The cap layer 47 has a dopant concentration of $1\times10^{19}$ cm$^{-3}$. The cap layer 47 has a thickness of 20 nm.

The semiconductor structure of FIG. 10 is processed into a high electron mobility transistor (HEMT). As previously indicated, the semiconductor structure of FIG. 10 uses the doped superlattice layer 45. The doped superlattice layer 45 is composed of Si-doped n-type $In_{0.8}Al_{0.2}As$ layers 45a and non-doped $In_{0.2}Al_{0.8}As$ layers 45b which alternate with each other in a laminate. The doped superlattice layer 45 has five periods of the alternation. Each of the $In_{0.8}Al_{0.2}As$ layers 45a has a thickness of 2 nm. Each of the $In_{0.2}Al_{0.8}As$ layers 45b has a thickness of 2 nm.

The degrees of lattice mismatching of an $In_{0.8}Al_{0.2}As$ crystal and an $In_{0.2}Al_{0.8}As$ crystal with an InP crystal are smaller than those of an InAs crystal and an AlAs crystal. Thus, it is easier to provide a thick doped superlattice layer 45. In addition, it is possible to provide a wider allowable range of conditions of crystal growth. As a result, the semiconductor structure of FIG. 10 is good in yield. In addition, the doped superlattice layer 45 enables a highly thermal stability of the semiconductor structure of FIG. 10.

In the doped superlattice layer 45, the $In_{0.8}Al_{0.2}As$ layers 45a and the $In_{0.2}Al_{0.8}As$ layers 45b alternate with each other in a laminate. The composition of the $In_{0.8}Al_{0.2}As$ layers 45a and the composition of the $In_{0.2}Al_{0.8}As$ layers 45b are symmetrical with respect to the composition of an $In_{0.5}Al_{0.5}As$ crystal. Accordingly, the mean composition (the average composition) of the doped superlattice layer 45 is close to the composition of the $In_{0.52}Al_{0.48}As$ layer 44 which is substantially equal in lattice constant to the InP substrate 41.

In view of a possible affection by a heat treatment (a heating process) which is shown in FIG. 19 explained later, the $In_{0.8}Al_{0.2}As$ layers 45a may be replaced by $In_XAl_{1-X}As$ ($1.0 \geq X > 0.8$) layers while the $In_{0.2}Al_{0.8}As$ layers 45b may be replaced by $In_{1-Y}Al_YAs$ ($0.8 < Y \leq 1.0$) layers.

Fourth Embodiment

Figure 11:
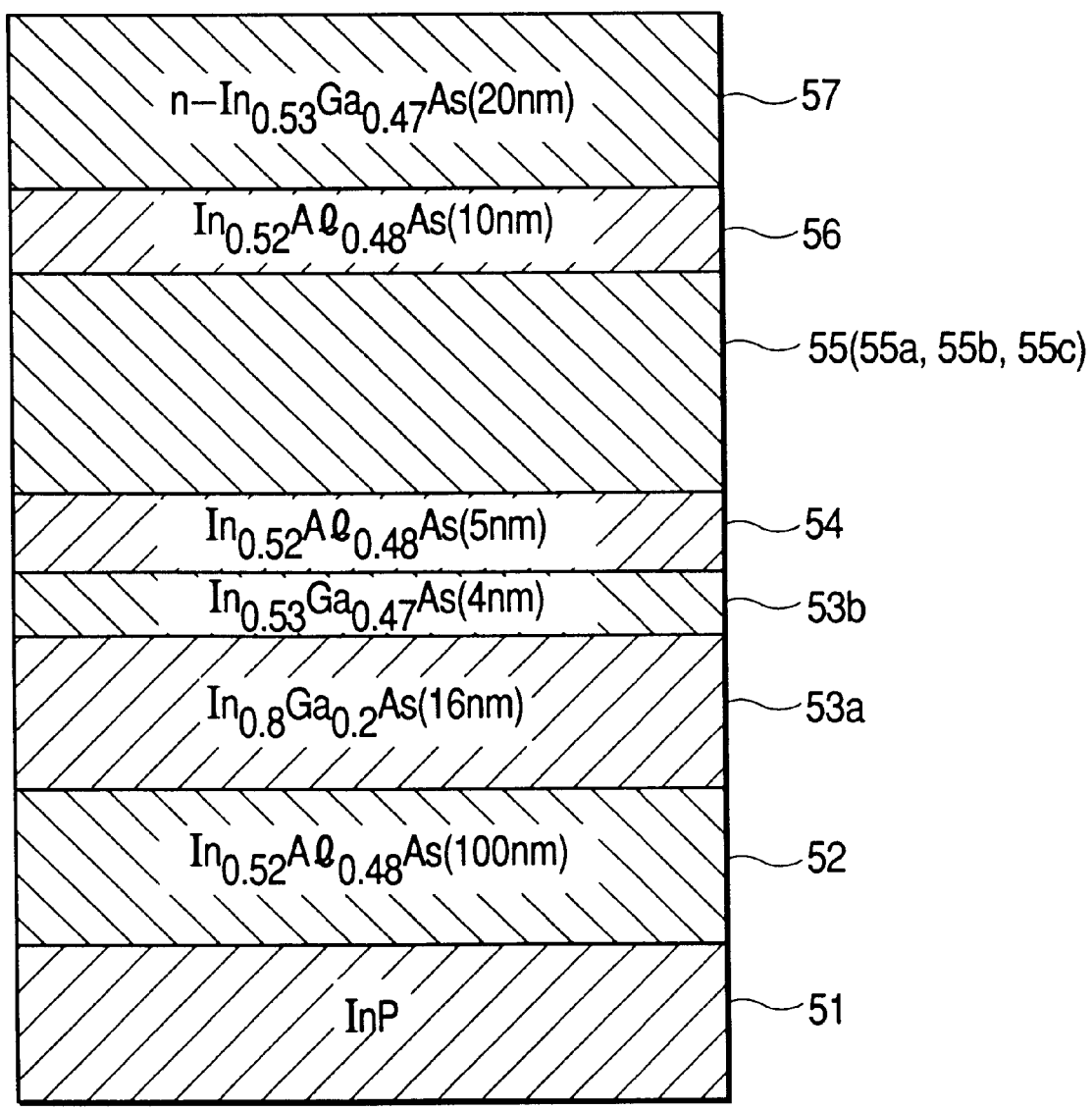
FIG. 11 is a diagrammatic section view of a semiconductor structure according to a fourth embodiment of this invention.

With reference to FIG. 11, a semiconductor structure includes a semi-insulating substrate 51 which is made of InP (indium phosphide). A buffer layer 52 is formed on the InP substrate 51. The buffer layer 52 is made of non-doped $In_{0.52}Al_{0.48}As$. The buffer layer 52 has a thickness of 100 nm.

A first channel layer 53a is formed on the buffer layer 52. The first channel layer 53a is made of non-doped $In_{0.8}Ga_{0.2}As$. The first channel layer 53a has a thickness of 16 nm. A second channel layer 53b is formed on the first channel layer 53a. The second channel layer 53b is made of non-doped $In_{0.53}Ga_{0.47}As$. The second channel layer 53b has a thickness of 4 nm. The second channel layer 53b serves as an electron distribution control layer. A spacer layer 54 is formed on the second channel layer 53b. The spacer layer 54 is made of non-doped $In_{0.52}Al_{0.48}As$. The spacer layer 54 has a thickness of 5 nm.

A doped superlattice layer 55 is formed on the spacer layer 54. The doped superlattice layer 55 serves as an electron supply layer. The doped superlattice layer 55 is composed of Si-doped n-type $In_{0.8}Al_{0.2}As$ layers 55a and non-doped $In_{0.2}Al_{0.8}As$ layers 55b which alternate with each other in a laminate. The doped superlattice layer 55 has five periods of the alternation. In other words, the doped superlattice layer 55 has an alternating structure of five Si-doped n-type $In_{0.8}Al_{0.2}As$ layers 55a and five non-doped $In_{0.2}Al_{0.8}As$ layers 55b. Each of the $In_{0.8}Al_{0.2}As$ layers 55a has a thickness of 2 nm. Each of the $In_{0.8}Al_{0.2}As$ layers 55a has a dopant concentration of about $1 \times 10^{19}$ cm$^{-3}$. Each of the $In_{0.2}Al_{0.8}As$ layers 55b has a thickness of 2 nm.

Figure 12:
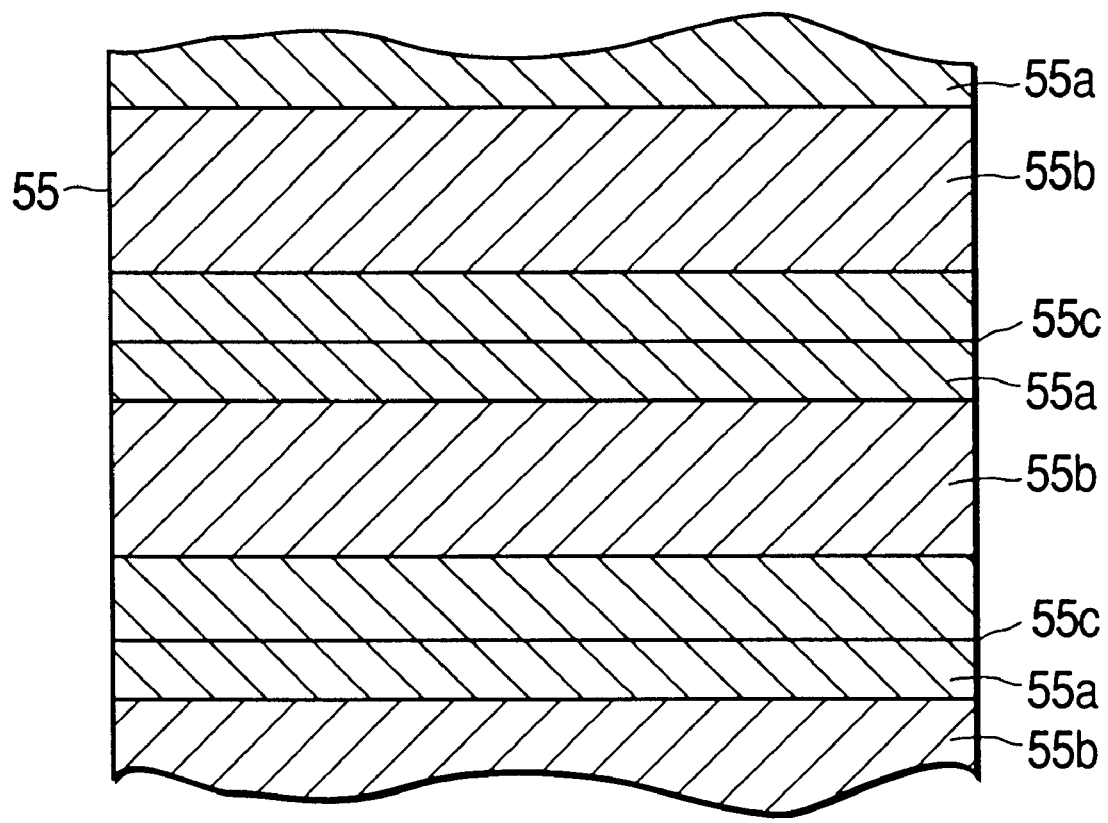
FIG. 12 is a diagrammatic section view of a doped superlattice layer in FIG. 11.

As shown in FIG. 12, an Si-δ-doped layer 55c is formed or provided in each of the n-type $In_{0.8}Al_{0.2}As$ layers 55a. The Si-δ-doped layers 55c have a thickness equal to, for example, the thickness of a 1-atom layer. The Si-δ-doped layers 55c enable Si atoms to be locally located.

A gate contact layer 56 is formed on the doped superlattice layer 55. The gate contact layer 56 is made of non-doped $In_{0.52}Al_{0.48}As$. The gate contact layer 56 has a thickness of 10 nm. A cap layer 57 is formed on the gate contact layer 56. The cap layer 57 is made of Si-doped n-type $In_{0.53}Al_{0.47}As$. The cap layer 57 has a dopant concentration of about $1 \times 10^{19}$ cm$^{-3}$. The cap layer 57 has a thickness of 20 nm.

The semiconductor structure of FIG. 11 is processed into a high electron mobility transistor (HEMT). As previously indicated, the semiconductor structure of FIG. 11 uses the doped superlattice layer 55. The doped superlattice layer 55 is composed of Si-doped n-type $In_{0.8}Al_{0.2}As$ layers 55a and non-doped $In_{0.2}Al_{0.8}As$ layers 55b which alternate with each other in a laminate. The doped superlattice layer 55 has five periods of the alternation. Each of the $In_{0.8}Al_{0.2}As$ layers 55a has a thickness of 2 nm. Each of the $In_{0.2}Al_{0.8}As$ layers 55b has a thickness of 2=nm. In the semiconductor structure of FIG. 11, an Si-δ-doped layer 55c is formed or provided in each of the n-type $In_{0.8}Al_{0.2}As$ layers 55a.

The doping efficiency related to the n-type $In_{0.8}Al_{0.2}As$ layers 55a can be improved by using the Si-δ-doped layers 55c. Accordingly, it is possible to attain good initial characteristics of the semiconductor structure (the HEMT) of FIG. 11.

The degrees of lattice mismatching of an $In_{0.8}Al_{0.2}As$ crystal and an $In_{0.2}Al_{0.8}As$ crystal with an InP crystal are smaller than those of an InAs crystal and an AlAs crystal. Thus, it is easier to provide a thick doped superlattice layer 55. In addition, it is possible to provide a wider allowable range of conditions of crystal growth. As a result, the semiconductor structure of FIG. 11 is good in yield. In addition, the doped superlattice layer 55 enables a highly thermal stability of the semiconductor structure of FIG. 11.

In the doped superlattice layer 55, the $In_{0.8}Al_{0.2}As$ layers 55a and the $In_{0.2}Al_{0.8}As$ layers 55b alternate with each other in a laminate. The composition of the $In_{0.8}Al_{0.2}As$ layers 55a and the composition of the $In_{0.2}Al_{0.8}As$ layers 55b are symmetrical with respect to the composition of an $In_{0.5}Al_{0.5}As$ crystal. Accordingly, the mean composition (the average composition) of the doped superlattice layer 55 is close to the composition of the $In_{0.52}Al_{0.48}As$ layer 54 which is substantially equal in lattice constant to the InP substrate 51.

In view of a possible affection by a heat treatment (a heating process) which is shown in FIG. 19 explained later, the $In_{0.8}Al_{0.2}As$ layers 55a may be replaced by $In_XAl_{1-X}As$ ($1.0 \geq X > 0.8$) layers while the $In_{0.2}Al_{0.8}As$ layers 55b may be replaced by $In_{1-Y}Al_YAs$ ($0.8 < Y \leq 1.0$) layers.

Fifth Embodiment

Figure 13:
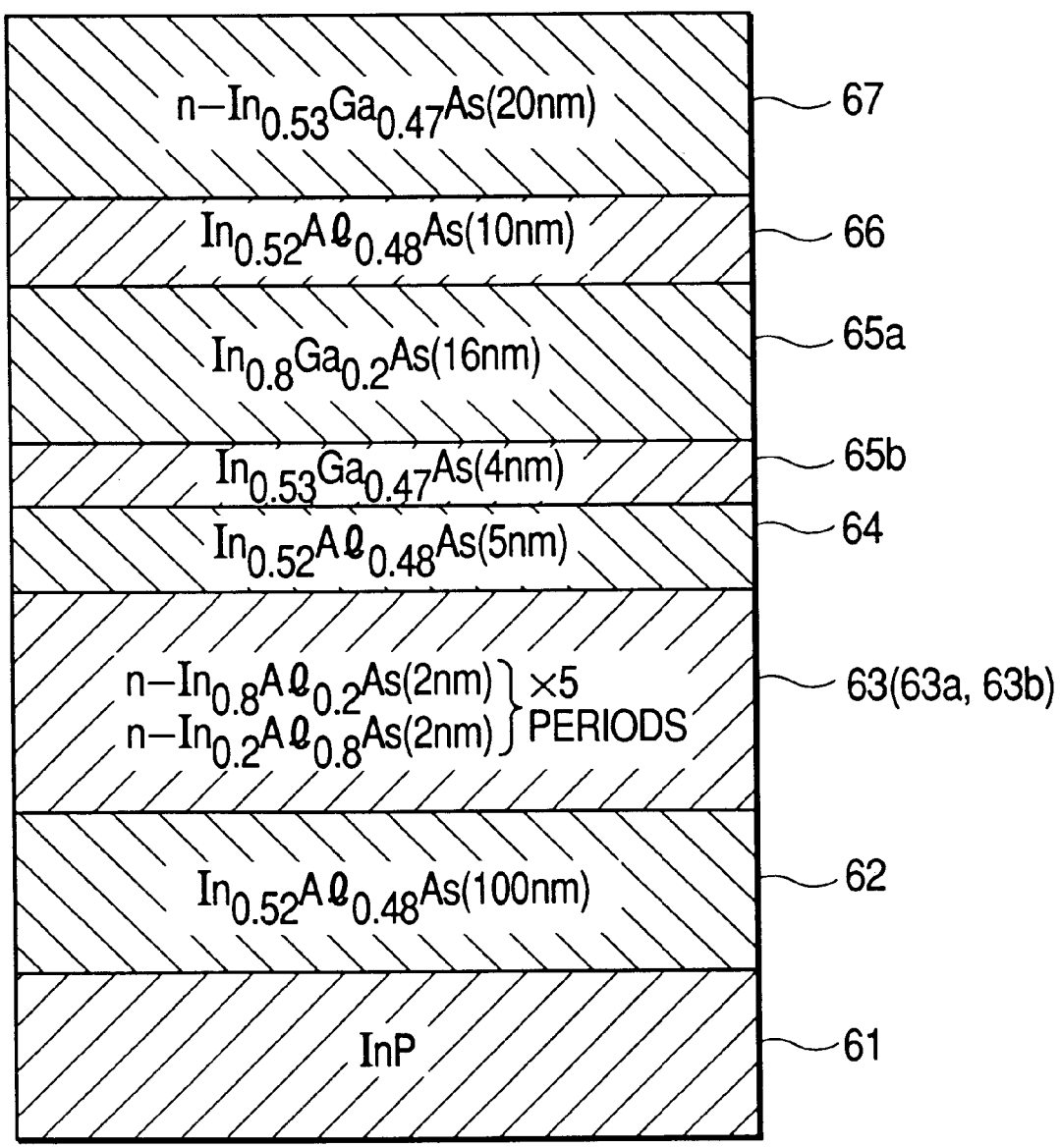
FIG. 13 is a diagrammatic section view of a semiconductor structure according to a fifth embodiment of this invention.

With reference to FIG. 13, a semiconductor structure includes a semi-insulating substrate 61 which is made of InP (indium phosphide). A buffer layer 62 is formed on the InP substrate 61. The buffer layer 62 is made of non-doped $In_{0.52}Al_{0.48}As$. The buffer layer 62 has a thickness of 100 nm.

A doped superlattice layer 63 is formed on the buffer layer 62. The doped superlattice layer 63 serves as an electron supply layer. The doped superlattice layer 63 is composed of Si-doped n-type $In_{0.8}Al_{0.2}As$ layers 63a and Si-doped n-type $In_{0.2}Al_{0.8}As$ layers 63b which alternate with each other in a laminate. The doped superlattice layer 63 has five periods of the alternation. In other words, the doped superlattice layer 63 has an alternating structure of five Si-doped n-type $In_{0.8}Al_{0.2}As$ layers 63a and five Si-doped n-type $In_{0.2}Al_{0.8}As$ layers 63b. Each of the $In_{0.8}Al_{0.2}As$ layers 63a has a thickness of 2 nm. Each of the $In_{0.8}Al_{0.2}As$ layers 63a has a dopant concentration of about $1 \times 10^{19}$ cm$^{-3}$. Each of the $In_{0.2}Al_{0.8}As$ layers 63b has a thickness of 2 nm. Each of the $In_{0.2}Al_{0.8}As$ layers 63b has a dopant concentration of, for example, about $1 \times 10^{19}$ cm$^{-3}$.

A spacer layer 64 is formed on the doped superlattice layer 63. The spacer layer 64 is made of non-doped $In_{0.52}Al_{0.48}As$. The spacer layer 64 has a thickness of 5 nm. A second channel layer 65b is formed on the spacer layer 64. The second channel layer 65b is made of non-doped $In_{0.53}Ga_{0.47}As$. The second channel layer 65b has a thickness of 4 nm. The second channel layer 65b serves as an electron distribution control layer. A first channel layer 65a is formed on the second channel layer 65b. The first channel layer 65a is made of non-doped $In_{0.8}Ga_{0.2}As$. The first channel layer 65a has a thickness of 16 nm.

A gate contact layer 66 is formed on the first channel layer 65a. The gate contact layer 66 is made of non-doped $In_{0.52}Al_{0.48}As$. The gate contact layer 66 has a thickness of 10 nm. A cap layer 67 is formed on the gate contact layer 66. The cap layer 67 is made of Si-doped n-type $In_{0.53}Al_{0.47}As$. The cap layer 67 has a dopant concentration of about $1 \times 10^{19}$ cm$^{-3}$. The cap layer 67 has a thickness of 20 nm.

Figure 14:
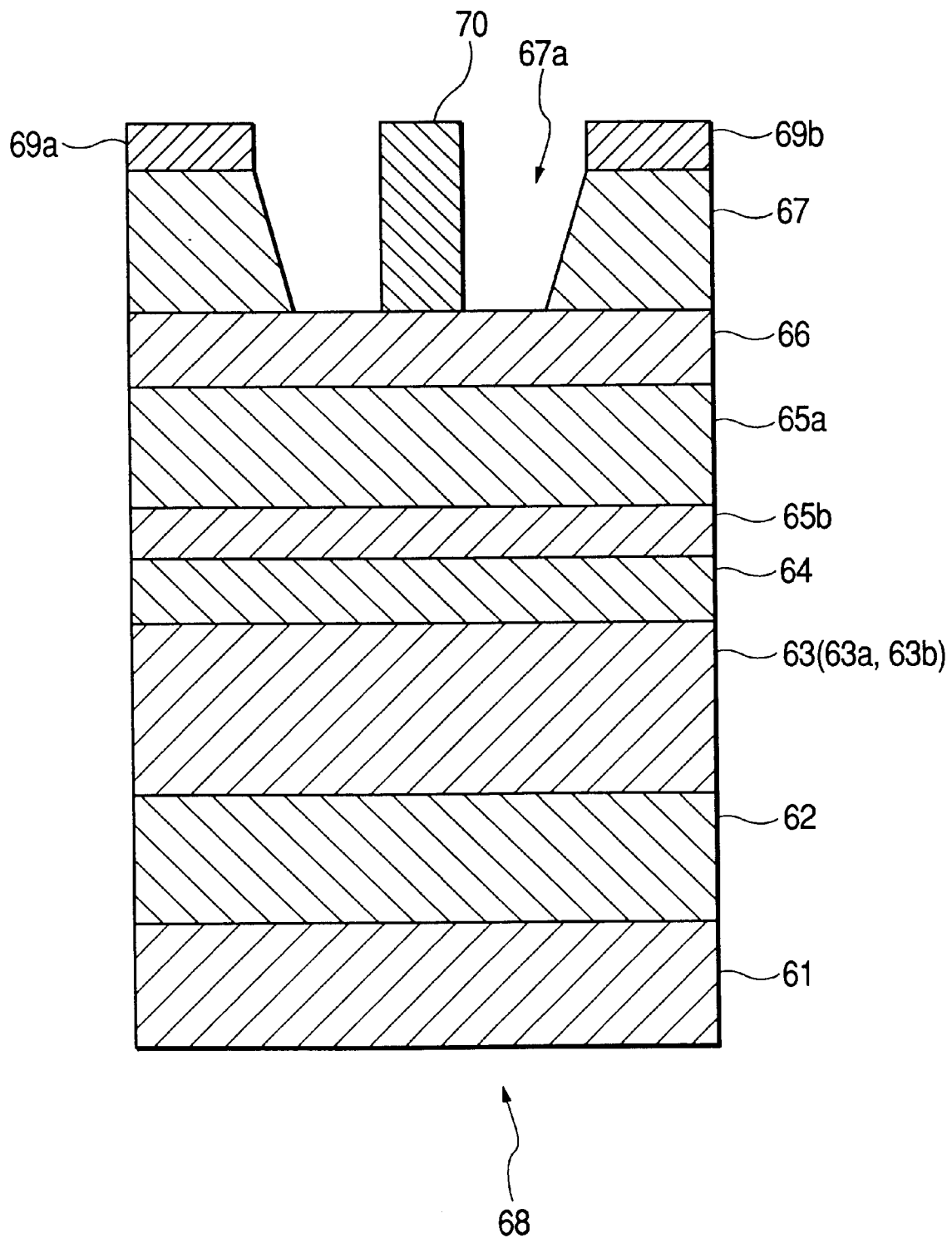
FIG. 14 is a diagrammatic section view of a HEMT in the fifth embodiment of this invention.

The semiconductor structure of FIG. 13 is processed into a high electron mobility transistor (HEMT) 68 which is shown in FIG. 14. The HEMT 68 of FIG. 14 includes ohmic electrodes serving as a source electrode 69a and a drain electrode 69b respectively. The source electrode 69a and the drain electrode 69b are formed on the cap layer 67. The source electrode 69a is in ohmic contact with the cap layer 67. The drain electrode 69b is in ohmic contact with the cap layer 67.

In the HEMT 68 of FIG. 14, the cap layer 67 has a recess 67a which is formed by a selective etching process. The gate contact layer 66 is exposed at the bottom of the recess 67a. A gate electrode 70 is formed or provided in the recess 67a. The gate electrode 70 extends on the gate contact layer 66. The gate electrode 70 is in Schottky contact with the gate contact layer 66.

The HEMT 68 of FIG. 14 is an inverted HEMT in which the positional relation between the channel layer 65 and the doped superlattice layer 63 is inverse with respect to the corresponding relation in a normal HEMT. The doped superlattice layer 63 enables a highly thermal stability of the semiconductor structure of FIG. 13 or the HEMT 68 of FIG. 14.

Sixth Embodiment

Figure 15:
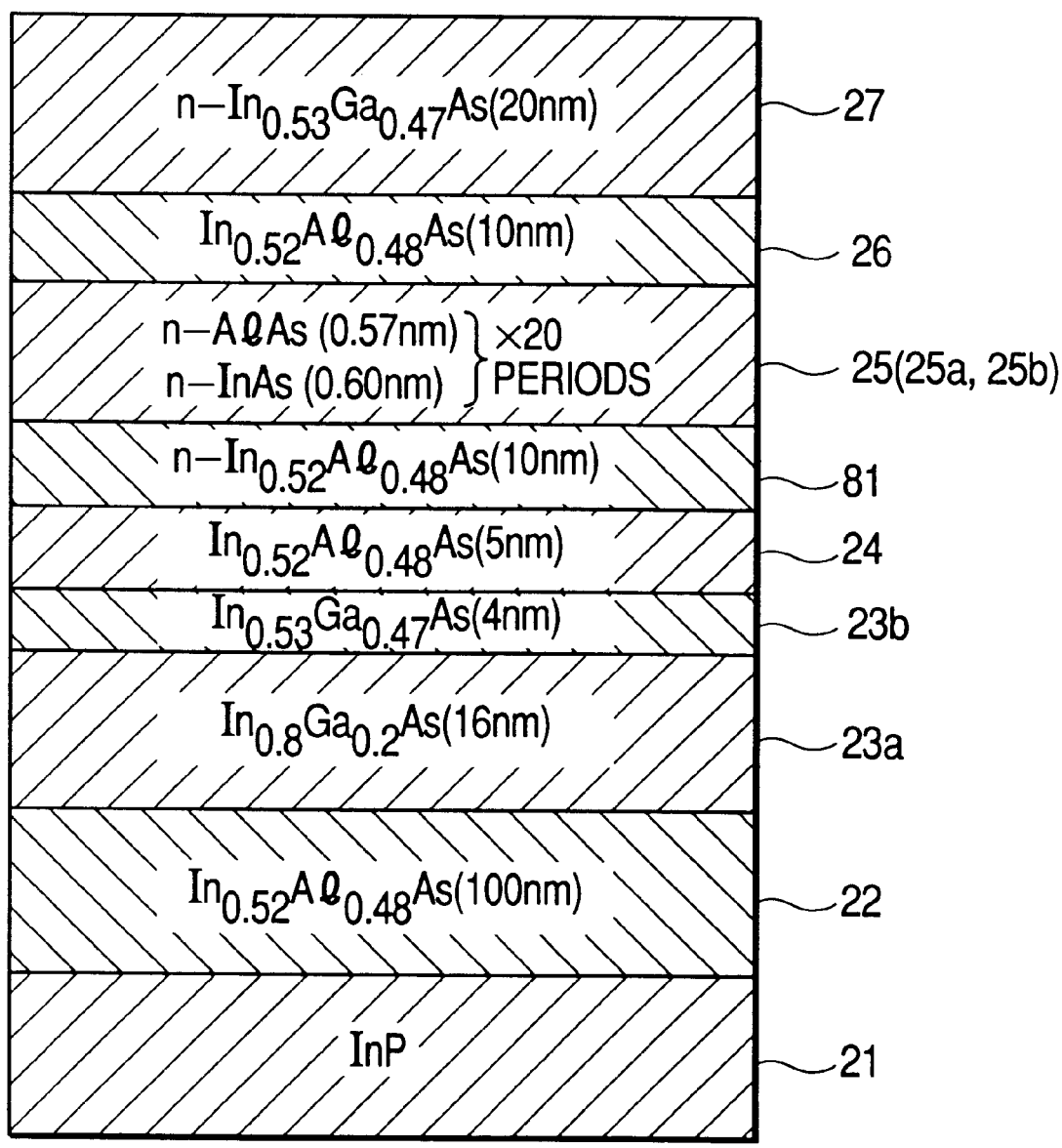
FIG. 15 is a diagrammatic section view of a semiconductor structure according to a sixth embodiment of this invention.

FIG. 15 shows a sixth embodiment of this invention which is similar to the first embodiment thereof except that a doped layer 81 is formed or provided between the spacer layer 24 and the doped superlattice layer 25. The doped layer 81 is made of doped n-type $In_{0.52}Al_{0.48}As$. The doped layer 81 has a relatively high dopant concentration. The doped layer 81 has a thickness of 10 nm. The doped layer 81 forms a portion of the electron supply layer.

In the semiconductor structure of FIG. 15, the doped superlattice layer 25 prevents a decrease in the ability to supply electrons which might be caused by a heat treatment on the n-type $In_{0.52}Al_{0.48}As$ layer. The doped superlattice layer 25 forms a portion of the electron supply layer. Accordingly, the doped superlattice layer 25 provides a relatively short distance between the electron supply layer and the source electrode 69a, the drain electrode 69a, or the gate electrode 70. Thus, it is possible to attain good initial characteristics of the semiconductor structure (the HEMT) of FIG. 15.

Seventh Embodiment

Figure 16:
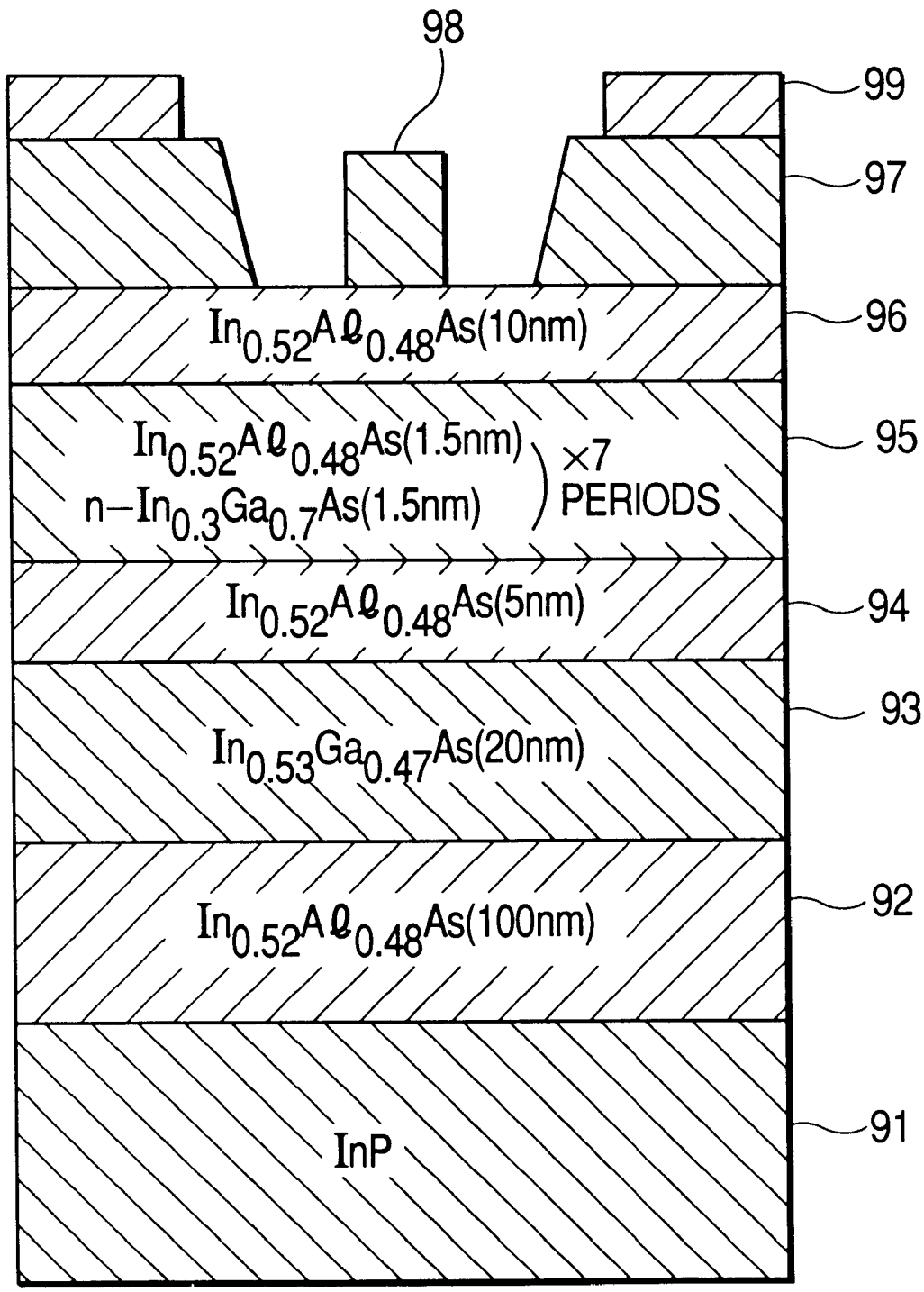
FIG. 16 is a diagrammatic section view of a HEMT in a seventh embodiment of this invention.

With reference to FIG. 16, a semiconductor device or a HEMT includes a semi-insulating substrate 91 which is made of InP (indium phosphide). A buffer layer 92 is formed on the InP substrate 91. The buffer layer 92 is made of non-doped $In_{0.52}Al_{0.48}As$. The buffer layer 92 has a thickness of 100 nm.

A channel layer 93 is formed on the buffer layer 92. The channel layer 93 is made of non-doped $In_{0.53}Ga_{0.47}As$. The channel layer 93 has a thickness of 20 nm. A spacer layer 94 is formed on the channel layer 93. The spacer layer 94 is made of non-doped $In_{0.52}Al_{0.48}As$. The spacer layer 94 has a thickness of 5 nm.

A doped superlattice layer 95 is formed on the spacer layer 94. The doped superlattice layer 95 serves as an electron supply layer. The doped superlattice layer 95 is composed of non-doped $In_{0.52}Al_{0.48}As$ layers and Si-doped $In_{0.3}Ga_{0.7}As$ layers which alternate with each other in a laminate. The doped superlattice layer 95 has seven periods of the alternation. In other words, the doped superlattice layer 95 has an alternating structure of seven non-doped $In_{0.52}Al_{0.48}As$ layers and seven Si-doped $In_{0.3}Ga_{0.7}As$ layers. Each of the $In_{0.52}Al_{0.48}As$ layers has a thickness of 1.5 nm. Each of the $In_{0.3}Ga_{0.7}As$ layers has a thickness of 1.5 nm.

A gate contact layer 96 is formed on the doped superlattice layer 95. The gate contact layer 96 is made of non-doped $In_{0.52}Al_{0.48}As$. The gate contact layer 96 has a thickness of 10 nm. A cap layer 97 is formed on the gate contact layer 96. The cap layer 97 is made of Si-doped n-type $In_{0.53}Al_{0.47}As$. The cap layer 97 has a thickness of 20 nm.

A portion of the cap layer 97 is removed by a selective etching process to uncover a part of the gate contact layer 96. A gate electrode 98 is formed on the uncovered part of the gate contact layer 96. The gate electrode 98 is in Schottky contact with the gate contact layer 96.

The semiconductor device of FIG. 16 includes ohmic electrodes 99 serving as a source electrode and a drain electrode respectively. The source electrode and the drain electrode are formed on the cap layer 97. The source electrode and the drain electrode are in ohmic contact with the cap layer 97. The ohmic electrodes 99 are used to drive a current into the HEMT. The gate electrode 98 is used to control the amount of electrons in the channel layer 93 and thereby to adjust the current through the HEMT.

The electron supply layer (the doped superlattice layer) 95 will be explained below in more detail. The non-doped $In_{0.52}Al_{0.48}As$ layers in the electron supply layer 95 are equal in lattice constant with the InP substrate 91 and other layers. On the other hand, the Si-doped $In_{0.3}Ga_{0.7}As$ layers in the electron supply layer 95 are different in lattice constant with the InP substrate 91 and other layers. Therefore, it is thought that if the thickness of the Si-doped $In_{0.3}Ga_{0.7}As$ layers exceeds a critical value, crystal defects occur therein and the quality of the crystals decreases. The decrease in the crystal quality would result in a reduction of the performances of the HEMT. Thus, it is preferable that the thickness of the Si-doped $In_{0.3}Ga_{0.7}As$ layers is smaller than the critical value.

Figure 17:
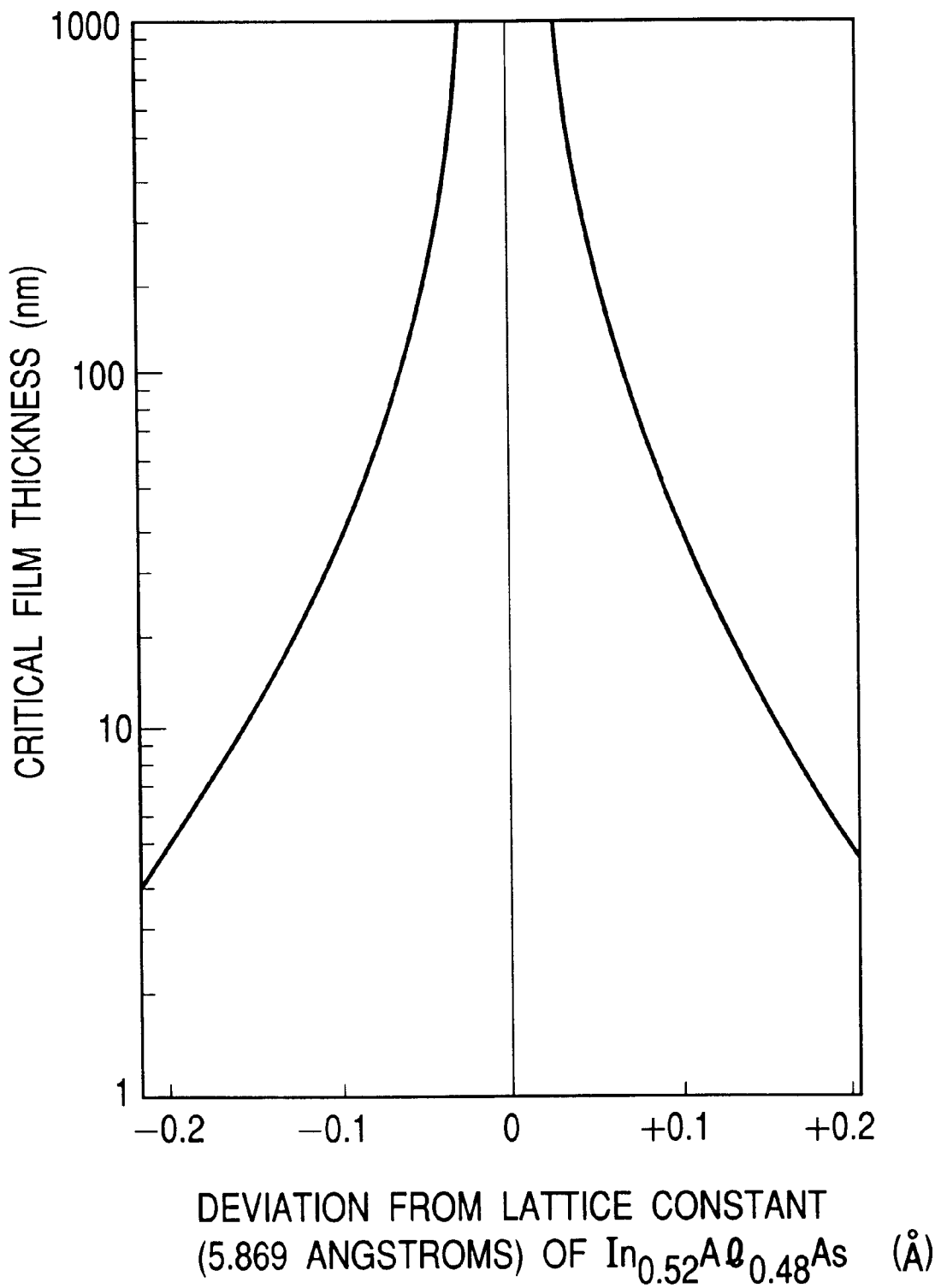
FIG. 17 is a diagram of the relation between the critical film thickness and the deviation from the lattice constant of an $In_{0.52}Al_{0.48}As$ crystal.

FIG. 17 shows the relation between the critical thickness of a layer and the deviation (the error) of the lattice constant of a crystal in the layer from 5.869 angstroms equal to the lattice constant of an InP crystal, an $In_{0.52}Al_{0.4}$ crystal, or an $In_{0.53}Ga_{0.47}As$ crystal. The relation in FIG. 17 is calculated on the basis of an equation by People (see J. crystal Growth, vol 27, p 118 (1974)). According to the relation in FIG. 17, if the lattice constant deviates from 5.869 angstroms by 0.1 angstrom in a minus side, the critical thickness is equal to about 30 nm.

Regarding the electron supply layer (the doped superlattice layer) 95, the lattice constant of the $In_{0.52}Al_{0.48}As$ layers is equal to 5.869 angstroms while the lattice constant of the Si-doped $In_{0.3}Ga_{0.7}As$ layers is equal to 5.775 angstroms. The thickness of each of the $In_{0.52}Al_{0.48}As$ layers is equal to 1.5 nm. Also, the thickness of each of the Si-doped $In_{0.3}Ga_{0.7}As$ layers is equal to 1.5 nm. Accordingly, the mean lattice constant (the average lattice constant) of the electron supply layer 95 is equal to 5.882 angstroms. The mean lattice constant (the average lattice constant) of the electron supply layer 95 deviates from 5.869 angstroms by 0.047 angstrom. According to the relation in FIG. 17, the critical thickness is equal to about 150 nm for the 0.047-angstrom lattice-constant deviation.

The electron supply layer (the superlattice doped layer) 95 has seven periods of the alternation of the $In_{0.52}Al_{0.48}As$ layer and the Si-doped $In_{0.3}Ga_{0.7}As$ layer. Each of the $In_{0.52}Al_{0.48}As$ layers has a thickness of 1.5 nm. Each of the $In_{0.3}Ga_{0.7}As$ layers has a thickness of $1.5$ nm. Thus, the thickness of the electron supply layer 95 is equal to 21 nm. This thickness of the electron supply layer 95 is smaller than the critical thickness, that is, about 150 nm. Accordingly, it is possible to prevent crystal defects from occurring in the electron supply layer 95 due to lattice mismatching.

Figure 18:
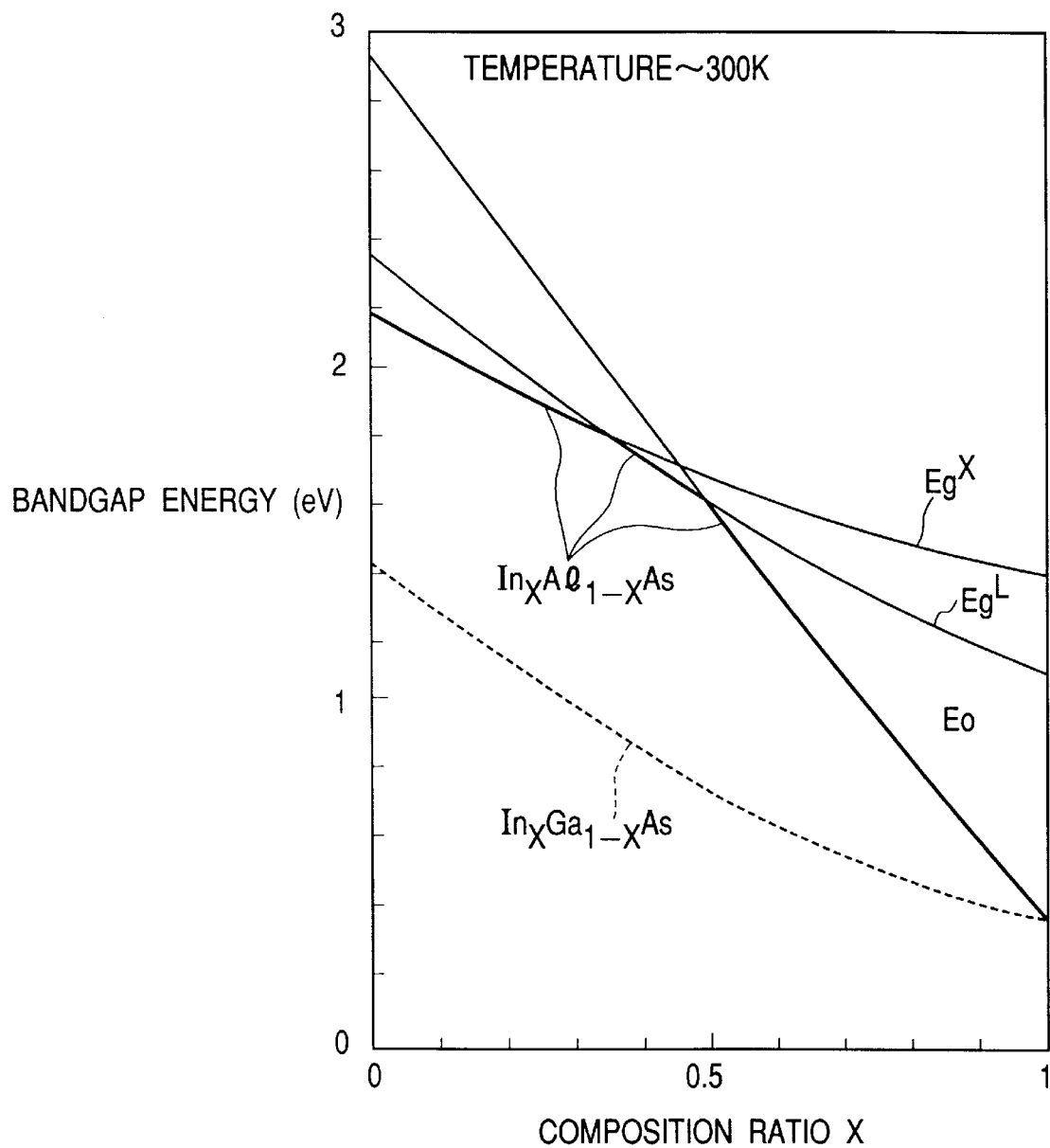
FIG. 18 is a diagram of the relation between the atomic fraction (the composition ratio) "X" and the bandgap energy of an $In_XAl_{1-X}As$ crystal, and the relation between the atomic fraction (the composition ratio) "X" and the bandgap energy of an $In_XGa_{1-X}As$ crystal.

FIG. 18 shows the results of calculation of the bandgap energies of an $In_XGa_{1-X}As$ layer and an $In_XAl_{1-X}As$ layer while the atomic fraction (the composition ratio) "X" varies from "0" to "1.0".

It is shown in FIG. 18 that the bandgap energy of an $In_{0.52}Al_{0.48}As$ layer is equal to 1.53 eV while the bandgap energy of an $In_{0.3}Ga_{0.7}As$ layer is equal to 0.98 eV. Thus, the calculation result of the equivalent bandgap energy of the electron supply layer 95 is equal to 1.26 eV. On the other hand, the bandgap energy of the channel layer 93 is equal to 0.71 eV. The equivalent bandgap energy of the electron supply layer 95 is sufficiently higher than the bandgap energy of the channel layer 93. Therefore, the doped superlattice layer 95 can serves as an effective electron supply layer.

In FIG. 18, Eo, $Eg^L$, and $Eg^X$ denote the bandgap energies related to indirect transitions in the $In_XAl_{1-X}As$ layer. As shown in FIG. 18, the bandgap energies Eo, $Eg^L$, and $Eg^X$ vary in accordance with the atomic fraction (the composition ratio) "X".

As previously indicated, the electron supply layer 95 is composed of non-doped $In_{0.52}Al_{0.48}As$ layers and Si-doped $In_{0.3}Ga_{0.7}As$ layers which alternate with each other in a laminate. The Si-doped $In_{0.3}Ga_{0.7}As$ layers cause the electron supply layer 95 to be of the n-type conductivity. The non-doped $In_{0.52}Al_{0.48}As$ layers prevent the carrier concentration in the electron supply layer 95 from being lowered by the entry of fluorine thereinto. Therefore, the electron supply layer 95 is thermally stable.

Regarding the electron supply layer 95, a process of doping $In_{0.3}Ga_{0.7}As$ layers with Si uses, for example, a δ-doping process or a planar doping process. During the δ-doping process or the planar doping process, an atomic layer is doped with Si when the growth of a crystal in an $In_{0.3}Ga_{0.7}As$ layer is temporarily suspended. The δ-doping process or the planar doping process can efficiently dope even a very thin layer.

Regarding the electron supply layer 95, the reason for doping only the $In_{0.3}Ga_{0.7}As$ layers with Si is as follows. Experiments were carried out on a layer of doped n-type InAs, a layer of doped n-type $In_{0.8}Al_{0.2}As$, a layer of doped n-type $In_{0.4}Al_{0.52}As$, a layer of doped n-type $In_{0.2}Al_{0.8}As$, a layer of doped n-type $Al_{0.87}Ga_{0.13}As$, a layer of doped n-type $Al_{0.3}Ga_{0.7}As$, a layer of doped n-type GaAs, a layer of doped n-type $In_{0.53}Ga_{0.47}As$, and a layer of doped n-type $In_{0.8}Ga_{0.2}As$. During the experiments, these layers were subjected to a heating process (a heat treatment). For example, these layers were held in a nitrogen (N2) atmosphere at 360° C. for two minutes. Regarding each of these layers, measurements were made as to the dopant concentration which occurred before the heating process and the dopant concentration which occurred after the heating process. Regarding each of these layers, calculation was given of the ratio between the dopant concentration measured before the heating process and the dopant concentration measured after the heating process.

FIG. 19 shows the calculated ratios between the dopant concentrations in the layer of doped n-type InAs, the layer of doped n-type $In_{0.8}Al_{0.2}As$, the layer of doped n-type $In_{0.48}Al_{0.52}As$, the layer of doped n-type $In_{0.2}Al_{0.8}As$, the layer of doped n-type $Al_{0.87}Ga_{0.13}As$, the layer of doped n-type $Al_{0.3}Ga_{0.7}As$, the layer of doped n-type GaAs, the layer of doped n-type $In_{0.53}Ga_{0.47}As$, and the layer of doped n-type $In_{0.8}Ga_{0.2}As$. In FIG. 19, there are concentric circles denoting different ratios (0.2, 0.4, 0.6, 0.8, and 1.0) respectively. In FIG. 19, the calculated ratios are marked on the concentric-circle arrangement.

With reference to FIG. 19, it is found that the heating-process-based deterioration in carrier concentration of the layer of $In_{0.52}Al_{0.48}As$ is considerably great while the heating-process-based deterioration in carrier concentration of the layer of $In_{0.3}Ga_{0.7}As$ is negligible. In the electron supply layer 95, the $In_{0.52}Al_{0.48}As$ layers are non-doped, and the $In_{0.3}Ga_{0.7}As$ layers are doped. Therefore, the heating-process-based deterioration in carrier concentration of the electron supply layer 95 is sufficiently small.

As previously indicated, the electron supply layer (the doped superlattice layer) 95 is composed of non-doped $In_{0.52}Al_{0.48}As$ layers and Si-doped $In_{0.3}Ga_{0.7}As$ layers which alternate with each other in a laminate. The electron supply layer 95 has seven periods of the alternation. In other words, the electron supply layer 95 has an alternating superlattice structure of seven non-doped $In_{0.52}Al_{0.48}As$ layers and seven Si-doped $In_{0.3}Ga_{0.7}As$ layers. Each of the $In_{0.52}Al_{0.48}As$ layers has a thickness of 1.5 nm. Each of the $In_{0.3}Ga_{0.7}As$ layers has a thickness of 1.5 nm. Even in the case where a heat treatment (a heating process) is carried out, the carrier concentration of the electron supply layer 95 can be prevented from decreasing due to the entry of fluorine thereinto. In addition, it is possible to prevent crystal defects from being caused by a difference in lattice constant. Thus, the HEMT of FIG. 16 has improved electric characteristics.

In the electron supply layer (the doped superlattice layer) 95, the $In_{0.52}Al_{0.48}As$ layers may be replaced by $In_XAl_{1-X}As$ layers where the atomic fraction (the composition ratio) "X" differs from 0.52. Also, in the electron supply layer (the doped superlattice layer) 95, the $In_{0.3}Ga_{0.7}As$ layers may be replaced by $In_XGa_{1-X}As$ layers where the atomic fraction (the composition ratio) "X" differs from 0.3.

In the electron supply layer (the doped superlattice layer) 95, the number of periods of the alternation of the $In_{0.52}Al_{0.48}As$ layer and the $In_{0.3}Ga_{0.7}As$ layer may differ from seven. In the electron supply layer (the doped superlattice layer) 95, the thickness of each of the $In_{0.52}Al_{0.48}As$ layers may differ from 1.5 nm, and the thickness of each of the $In_{0.3}Ga_{0.7}As$ layers may differ from 1.5 nm.

Eighth Embodiment

Figure 20:
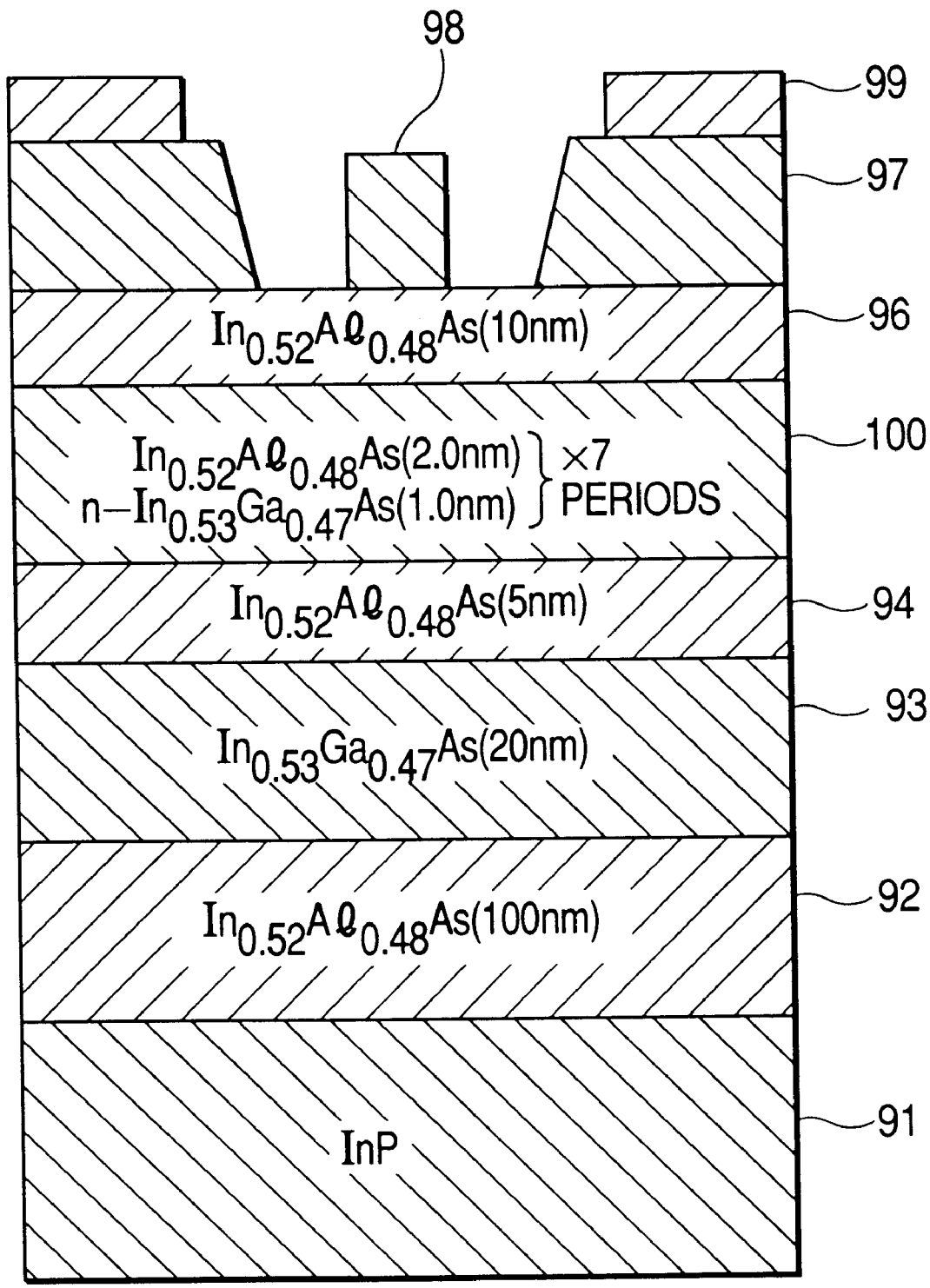
FIG. 20 is a diagrammatic section view of a HEMT in an eighth embodiment of this invention.

FIG. 20 shows an eighth embodiment of this invention which is similar to the seventh embodiment thereof except that an electron supply layer (a doped superlattice layer) 100 replaces the electron supply layer 95 (see FIG. 16).

The electron supply layer 100 is composed of non-doped $In_{0.52}Al_{0.48}As$ layers and Si-doped $In_{0.53}Ga_{0.47}As$ layers which alternate with each other in a laminate. The electron supply layer 100 has seven periods of the alternation. In other words, the electron supply layer 100 has an alternating superlattice structure of seven non-doped $In_{0.52}Al_{0.48}As$ layers and seven Si-doped $In_{0.53}Ga_{0.47}As$ layers. Each of the $In_{0.52}Al_{0.48}As$ layers has a thickness of 2.0 nm. Each of the $In_{0.53}Ga_{0.47}As$ layers has a thickness of 1.0 nm.

The lattice constants of the $In_{0.52}Al_{0.48}As$ layers and the $In_{0.53}Ga_{0.47}As$ layers in the electron supply layer 100 are equal to the lattice constant of the InP substrate 91. Therefore, it is unnecessary to consider lattice mismatching. Thus, it is possible to prevent crystal defects from being caused by lattice mismatching.

It is shown in FIG. 18 that the bandgap energy of an $In_{0.52}Al_{0.48}As$ layer is equal to 1.53 eV while the bandgap energy of an $In_{0.53}Ga_{0.47}As$ layer is equal to 0.71 eV. Thus, the calculation result of the equivalent bandgap energy of the electron supply layer 100 is equal to 1.26 eV. The equivalent bandgap energy of the electron supply layer 100 is equal to that of the electron supply layer 95 in the seventh embodiment of this invention. This suitable bandgap energy of the electron supply layer 100 is provided by making the $In_{0.52}Al_{0.4}As$ layers thicker than the $In_{0.53}Ga_{0.47}As$ layers.

In the electron supply layer 100, only the $In_{0.53}Ga_{0.47}As$ layers are doped. It is shown in FIG. 19 that the heating-process-based deterioration in carrier concentration of a layer of $In_{0.53}Ga_{0.47}As$ is negligible. Even in the case where a heat treatment (a heating process) is carried out, the carrier concentration of the electron supply layer 100 can be prevented from decreasing due to the entry of fluorine thereinto. Therefore, the electron supply layer 100 is thermally stable.

In the electron supply layer 100, the number of periods of the alternation of the $In_{0.52Al0.48}As$ layer and the $In_{0.53}Ga_{0.47}As$ layer may differ from seven. In the electron supply layer 100, the thickness of each of the $In_{0.52}Al_{0.48}As$ layers may differ from 2.0 nm, and the thickness of each of the $In_{0.53}Ga_{0.47}As$ layers may differ from 1.0 nm.

Ninth Embodiment

Figure 21:
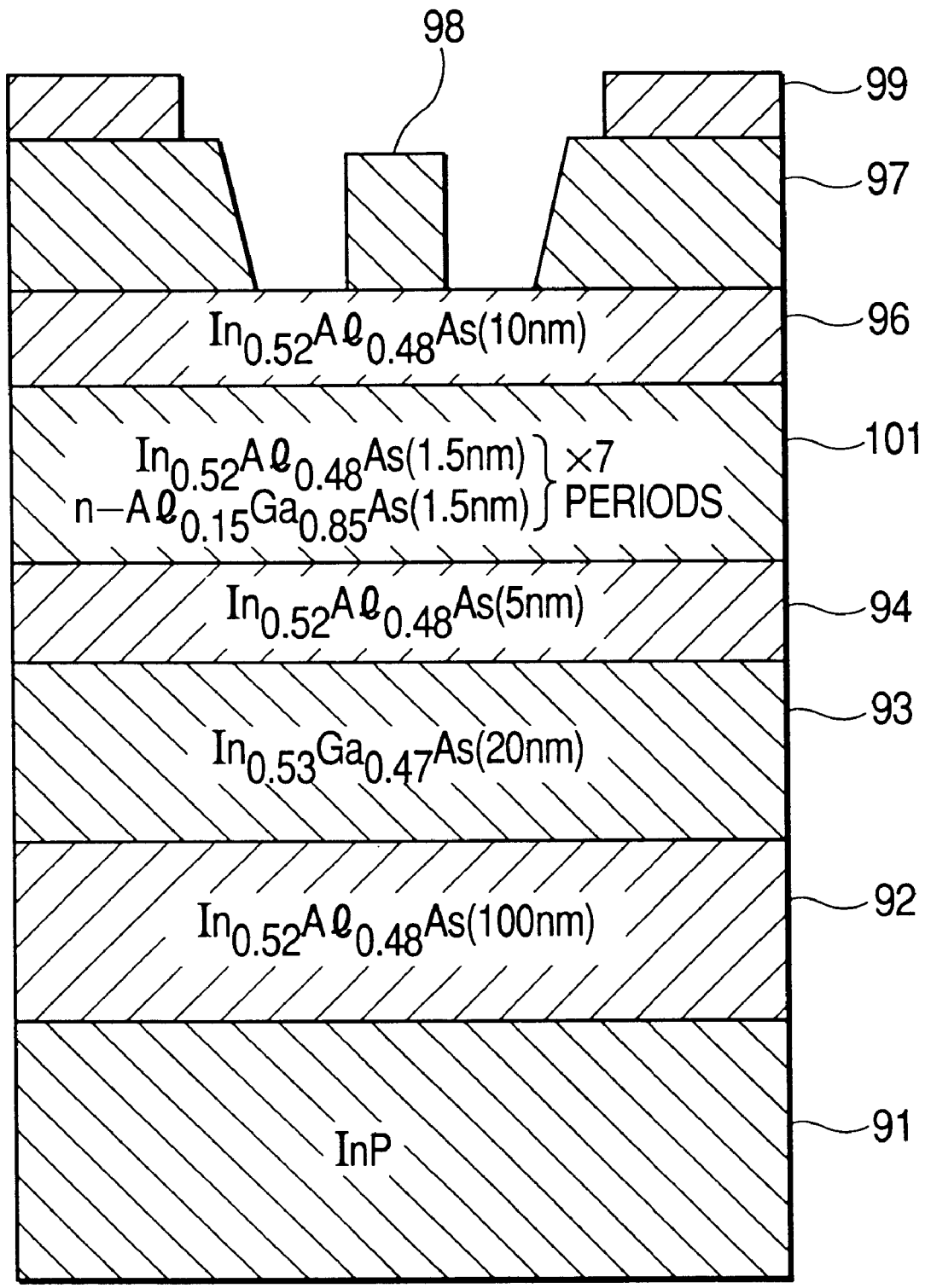
FIG. 21 is a diagrammatic section view of a HEMT in a ninth embodiment of this invention.

FIG. 21 shows a ninth embodiment of this invention which is similar to the seventh embodiment thereof except that an electron supply layer (a doped superlattice layer) 101 replaces the electron supply layer 95 (see FIG. 16).

The electron supply layer 101 is composed of non-doped $In_{0.52}Al_{0.48}As$ layers and Si-doped $Al_{0.15}Ga_{0.85}As$ layers which alternate with each other in a laminate. The electron supply layer 101 has seven periods of the alternation. In other words, the electron supply layer 101 has an alternating superlattice structure of seven non-doped $In_{0.52}Al_{0.48}As$ layers and seven Si-doped $Al_{0.15}Ga_{0.85}As$ layers. Each of the $In_{0.52}Al_{0.48}As$ layers has a thickness of 1.5 nm. Each of the $Al_{0.15}Ga_{0.85}As$ layers has a thickness of 1.5 nm.

Regarding the electron supply layer (the doped superlattice layer) 101, the lattice constant of the $In_{0.52}Al_{0.48}As$ layers is equal to 5.869 angstroms while the lattice constant of the Si-doped $Al_{0.15}Ga_{0.8}As$ layers is equal to 5.654 angstroms. The thickness of each of the $In_{0.52}Al_{0.48}As$ layers is equal to 1.5 nm. Also, the thickness of each of the Si-doped $Al_{0.15}Ga_{0.85}As$ layers is equal to 1.5 nm. Accordingly, the mean lattice constant (the average lattice constant) of the electron supply layer 101 is equal to 5.761 angstroms. The mean lattice constant (the average lattice constant) of the electron supply layer 101 deviates from 5.869 angstroms (the lattice constants of the InP substrate 91 and the $In_{0.52}Al_{0.48}As$ layers) by −0.108 angstrom. According to the relation in FIG. 17, the critical thickness is equal to about 25 nm for the −0.108-angstrom lattice-constant deviation.

The electron supply layer (the superlattice doped layer) 101 has seven periods of the alternation of the $In_{0.52}Al_{0.48}As$ layer and the Si-doped $Al_{0.15}Ga_{0.85}As$ layer. Each of the $In_{0.52}Al_{0.48}As$ layers has a thickness of 1.5 nm. Each of the $Al_{0.15}Ga_{0.85}As$ layers has a thickness of 1.5 nm. Thus, the thickness of the electron supply layer 101 is equal to 21 nm. This thickness of the electron supply layer 101 is smaller than the critical thickness, that is, about 25 nm. Accordingly, it is possible to prevent crystal defects from occurring in the electron supply layer 101 due to lattice mismatching.

Figure 22:
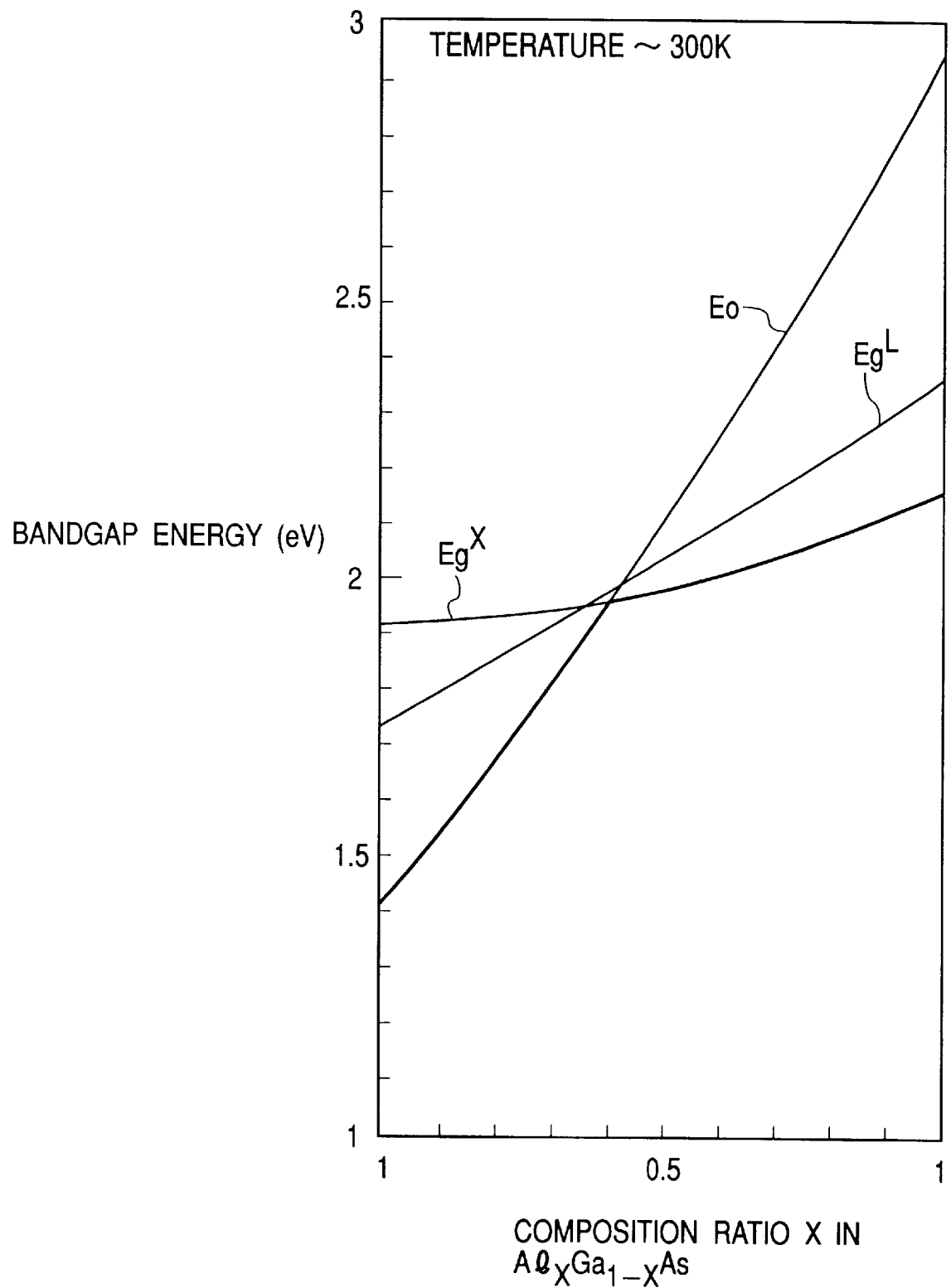
FIG. 22 is a diagram of the relation between the atomic fraction (the composition ratio) "X" and the bandgap energy of an $Al_XGa_{1-X}As$ crystal.

It is shown in FIG. 18 that the bandgap energy of an $In_{0.52}Al_{0.48}As$ layer is equal to 1.53 eV. It is shown in FIG. 22 that the bandgap energy of an $Al_{0.15}Ga_{0.85}As$ layer is equal to 1.60 eV. Thus, the calculation result of the equivalent bandgap energy of the electron supply layer 101 is equal to 1.57 eV. The equivalent bandgap energy of the electron supply layer 101 is greater than that of the electron supply layer 95 in the seventh embodiment of this invention. Accordingly, it is possible to attain a sufficient ability to supply electrons.

In the electron supply layer 101, only the $Al_{0.15}Ga_{0.85}As$ layers are doped with Si. It is known that a deep energy level called a DX center is caused by Si and hence the electron supply performance of an Si-doped $Al_xGa_{1-x}As$ layer significantly drops as the atomic fraction (the composition ratio) "X" increases above 0.2. Since the atomic fraction (the composition ratio) "X" of the $Al_{0.15}Ga_{0.85}As$ layers is equal to 0.15, it is possible to prevent a problem from being caused by a DX center. The $Al_{0.15}Ga_{0.85}As$ layers can be efficiently doped.

As previously indicated, the electron supply layer 101 includes the Si-doped $Al_{0.15}Ga_{0.85}As$ layers. It is shown in FIG. 19 that the heating-process-based deterioration in carrier concentration of a layer of $Al_{0.15}Ga_{0.85}As$ is negligible. Even in the case where a heat treatment (a heating process) is carried out, the carrier concentration of the electron supply layer 101 can be prevented from decreasing due to the entry of fluorine thereinto.

In the electron supply layer 101, the number of periods of the alternation of the $In_{0.52}Al_{0.48}As$ layer and the $Al_{0.15}Ga_{0.85}As$ may differ from seven. In the electron supply layer 101, the thickness of each of the $In_{0.52}Al_{0.48}As$ layers may differ from 1.5 nm, and the thickness of each of the $Al_{0.15}Ga_{0.85}As$ layers may differ from 1.5 nm.

Tenth Embodiment

Figure 23:
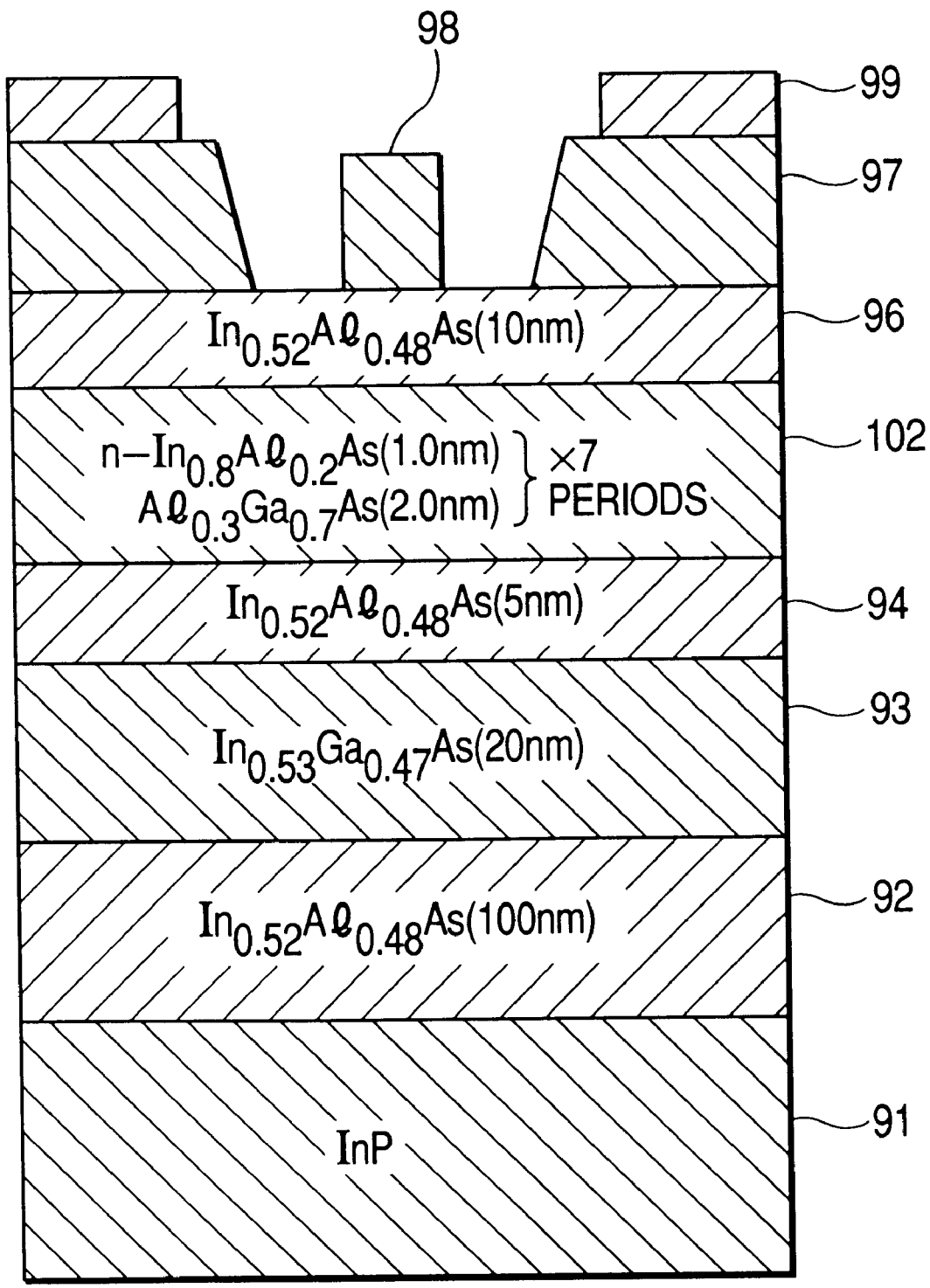
FIG. 23 is a diagrammatic section view of a HEMT in a tenth embodiment of this invention.

FIG. 23 shows a tenth embodiment of this invention which is similar to the seventh embodiment thereof except that an electron supply layer (a doped superlattice layer) 102 replaces the electron supply layer 95 (see FIG. 16).

The electron supply layer 102 is composed of Si-doped $In_{0.8}Al_{0.2}As$ layers and non-doped $Al_{0.3}Ga_{0.7}As$ layers which alternate with each other in a laminate. The electron supply layer 102 has seven periods of the alternation. In other words, the electron supply layer 102 has an alternating superlattice structure of seven Si-doped $In_{0.8}Al_{0.2}As$ layers and seven non-doped $Al_{0.3}Ga_{0.7}As$ layers. Each of the $In_{0.8}Al_{0.2}As$ layers has a thickness of 1.0 nm. Each of the $Al_{0.3}Ga_{0.7}As$ layers has a thickness of 2.0 nm.

Regarding the electron supply layer (the doped superlattice layer) 102, the lattice constant of the $In_{0.8}Al_{0.2}As$ layers is equal to 5.979 angstroms while the lattice constant of the $Al_{0.3}Ga_{0.7}As$ layers is equal to 5.656 angstroms. The thickness of each of the $In_{0.8}Al_{0.2}As$ layers is equal to 1.0 nm. The thickness of each of the $Al_{0.3}Ga_{0.7}As$ layers is equal to 2.0 nm. Accordingly, the mean lattice constant (the average lattice constant) of the electron supply layer 102 is equal to 5.764 angstroms. The mean lattice constant (the average lattice constant) of the electron supply layer 102 deviates from 5.869 angstroms (the lattice constants of the InP substrate 91 and the $In_{0.52}Al_{0.48}As$ layers) by −0.105 angstrom. According to the relation in FIG. 17, the critical thickness is equal to about 25 nm for the −0.105-angstrom lattice-constant deviation.

The electron supply layer (the superlattice doped layer) 102 has seven periods of the alternation of the $In_{0.8}Al_{0.2}As$ layer and the $Al_{0.3}Ga_{0.7}As$ layer. Each of the $In_{0.8}Al_{0.2}As$ layers has a thickness of 1.0 nm. Each of the $Al_{0.3}Ga_{0.7}As$ layers has a thickness of 2.0 nm. Thus, the thickness of the electron supply layer 102 is equal to 21 nm. This thickness of the electron supply layer 102 is smaller than the critical thickness, that is, about 25 nm. Accordingly, it is possible to prevent crystal defects from occurring in the electron supply layer 102 due to lattice mismatching.

It is shown in FIG. 18 that the bandgap energy of an $In_{0.8}Al_{0.2}As$ layer is equal to 0.83 eV. It is shown in FIG. 22 that the bandgap energy of an $Al_{0.3}Ga_{0.7}As$ layer is equal to 1.80 eV. Thus, the calculation result of the equivalent bandgap energy of the electron supply layer 102 is equal to 1.47 eV. The equivalent bandgap energy of the electron supply layer 102 is greater than that of the electron supply layer 95 in the seventh embodiment of this invention. Accordingly, it is possible to attain a sufficient ability to supply electrons.

In the electron supply layer 102, only the $In_{0.8}Al_{0.2}As$ layers are doped with Si. The heating-process-based deterioration in carrier concentration of an Si-doped $In_xAl_{1-x}As$ layer is small when the atomic fraction (the composition ratio) "X" is equal to or smaller than 0.2, or when the atomic fraction (the composition ratio) "X" is equal to or greater than 0.8. Since the atomic fraction (the composition ratio) "X" of the $In_{0.8}Al_{0.2}As$ layers is equal to 0.2, the heating-process-based deterioration in carrier concentration of the $In_{0.8}Al_{0.2}As$ layers is small.

In the electron supply layer 102, the number of periods of the alternation of the $In_{0.8}Al_{0.2}As$ layer and the $Al_{0.3}Ga_{0.7}As$ layer may differ from seven. In the electron supply layer 102, the thickness of each of the $In_{0.8}Al_{0.2}As$ layers may differ from 1.0 nm, and the thickness of each of the $Al_{0.3}Ga_{0.7}As$ layers may differ from 2.0 nm.

Eleventh Embodiment

Figure 24:
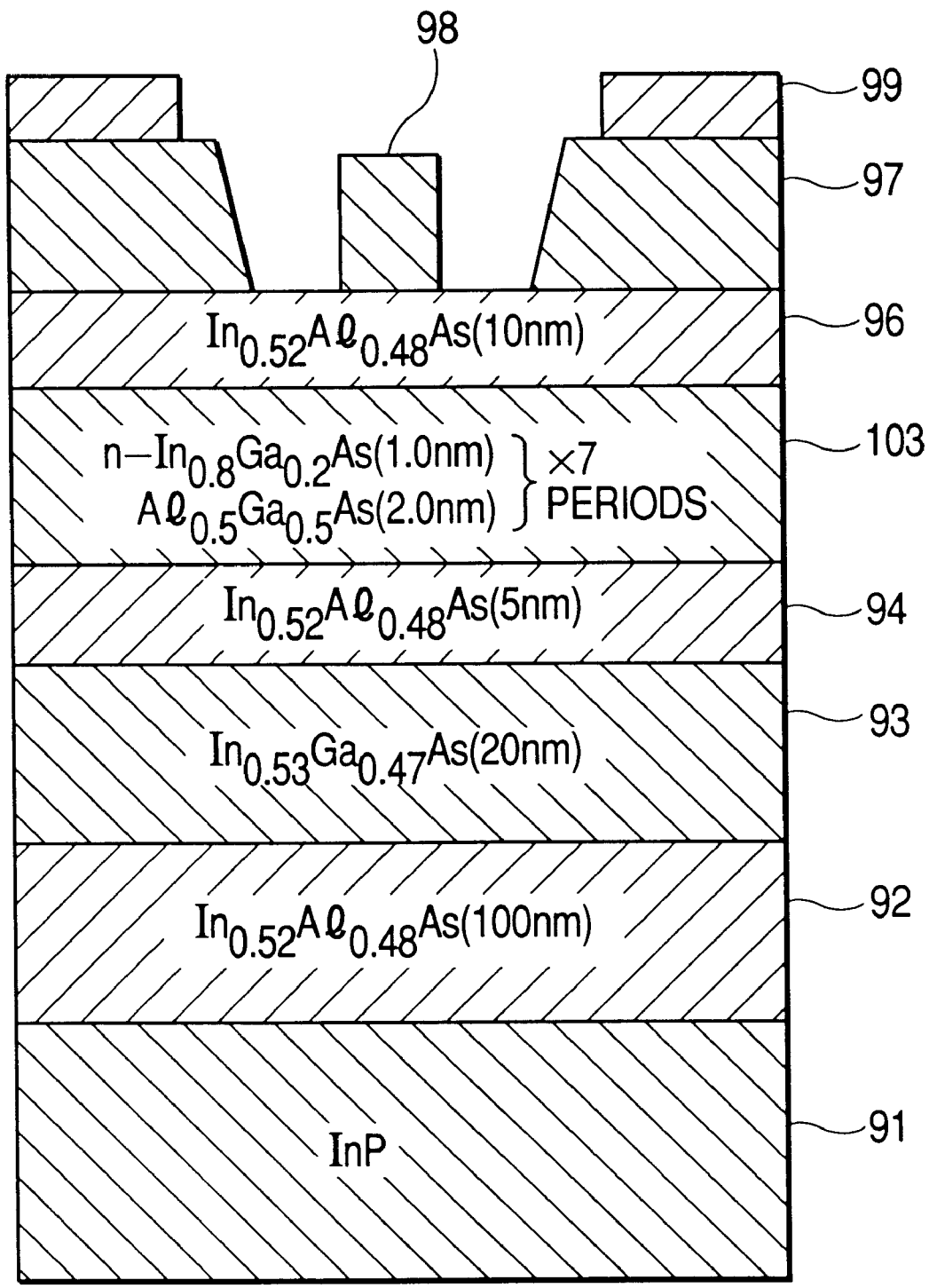
FIG. 24 is a diagrammatic section view of a HEMT in an eleventh embodiment of this invention.

FIG. 24 shows an eleventh embodiment of this invention which is similar to the seventh embodiment thereof except that an electron supply layer (a doped superlattice layer) 103 replaces the electron supply layer 95 (see FIG. 16).

The electron supply layer 103 is composed of Si-doped $In_{0.8}Ga_{0.2}As$ layers and non-doped $Al_{0.5}Ga_{0.5}As$ layers which alternate with each other in a laminate. The electron supply layer 103 has seven periods of the alternation. In other words, the electron supply layer 103 has an alternating superlattice structure of seven Si-doped $In_{0.8}Ga_{0.2}As$ layers and seven non-doped $Al_{0.5}Ga_{0.5}As$ layers. Each of the $In_{0.8}Ga_{0.2}As$ layers has a thickness of 1.0 nm. Each of the $Al_{0.5}Ga_{0.5}As$ layers has a thickness of 2.0 nm.

Regarding the electron supply layer (the doped superlattice layer) 103, the lattice constant of the $In_{0.8}Ga_{0.2}As$ layers is equal to 5.977 angstroms while the lattice constant of the $Al_{0.5}Ga_{0.5}As$ layers is equal to 5.657 angstroms. The thickness of each of the $In_{0.8}Ga_{0.2}As$ layers is equal to 1.0 nm. The thickness of each of the $Al_{0.5}Ga_{0.5}As$ layers is equal to 2.0 nm. Accordingly, the mean lattice constant (the average lattice constant) of the electron supply layer 103 is equal to 5.764 angstroms. The mean lattice constant (the average lattice constant) of the electron supply layer 103 deviates from 5.869 angstroms (the lattice constants of the InP substrate 91 and the $In_{0.52}Al_{0.48}As$ layers) by −0.105 angstrom. According to the relation in FIG. 17, the critical thickness is equal to about 25 nm for the −0.105-angstrom lattice-constant deviation.

The electron supply layer (the superlattice doped layer) 103 has seven periods of the alternation of the $In_{0.8}Ga_{0.2}As$ layer and the $Al_{0.5}Ga_{0.5}As$ layer. Each of the $In_{0.8}Ga_{0.2}As$ layers has a thickness of 1.0 nm. Each of the $Al_{0.5}Ga_{0.5}As$ layers has a thickness of 2.0 nm. Thus, the thickness of the electron supply layer 103 is equal to 21 nm. This thickness of the electron supply layer 103 is smaller than the critical thickness, that is, about 25 nm. Accordingly, it is possible to prevent crystal defects from occurring in the electron supply layer 103 due to lattice mismatching.

It is shown in FIG. 18 that the bandgap energy of an $In_{0.8}Ga_{0.2}As$ layer is equal to 0.47 eV. It is shown in FIG. 22 that the bandgap energy of an $Al_{0.5}Ga_{0.5}As$ layer is equal to 1.97 eV. Thus, the calculation result of the equivalent bandgap energy of the electron supply layer 103 is equal to 1.47 eV. The equivalent bandgap energy of the electron supply layer 103 is greater than that of the electron supply layer 95 in the seventh embodiment of this invention. Accordingly, it is possible to attain a sufficient ability to supply electrons.

In the electron supply layer 103, only the $In_{0.8}Ga_{0.2}As$ layers are doped with Si. It is shown in FIG. 19 that the heating-process-based deterioration in carrier concentration of a layer of $In_{0.8}Ga_{0.2}As$ is negligible. Even in the case where a heat treatment (a heating process) is carried out, the carrier concentration of the electron supply layer 103 can be prevented from decreasing due to the entry of fluorine thereinto. Therefore, the electron supply layer 103 is thermally stable.

In the electron supply layer 103, the number of periods of the alternation of the $In_{0.8}Ga_{0.2}As$ layer and the $Al_{0.5}Ga_{0.5}As$ layer may differ from seven. In the electron supply layer 103, the thickness of each of the $In_{0.8}Ga_{0.2}As$ layers may differ from 1.0 nm, and the thickness of each of the $Al_{0.5}Ga_{0.5}As$ layers may differ from 2.0 nm.

Twelfth Embodiment

Figure 25:
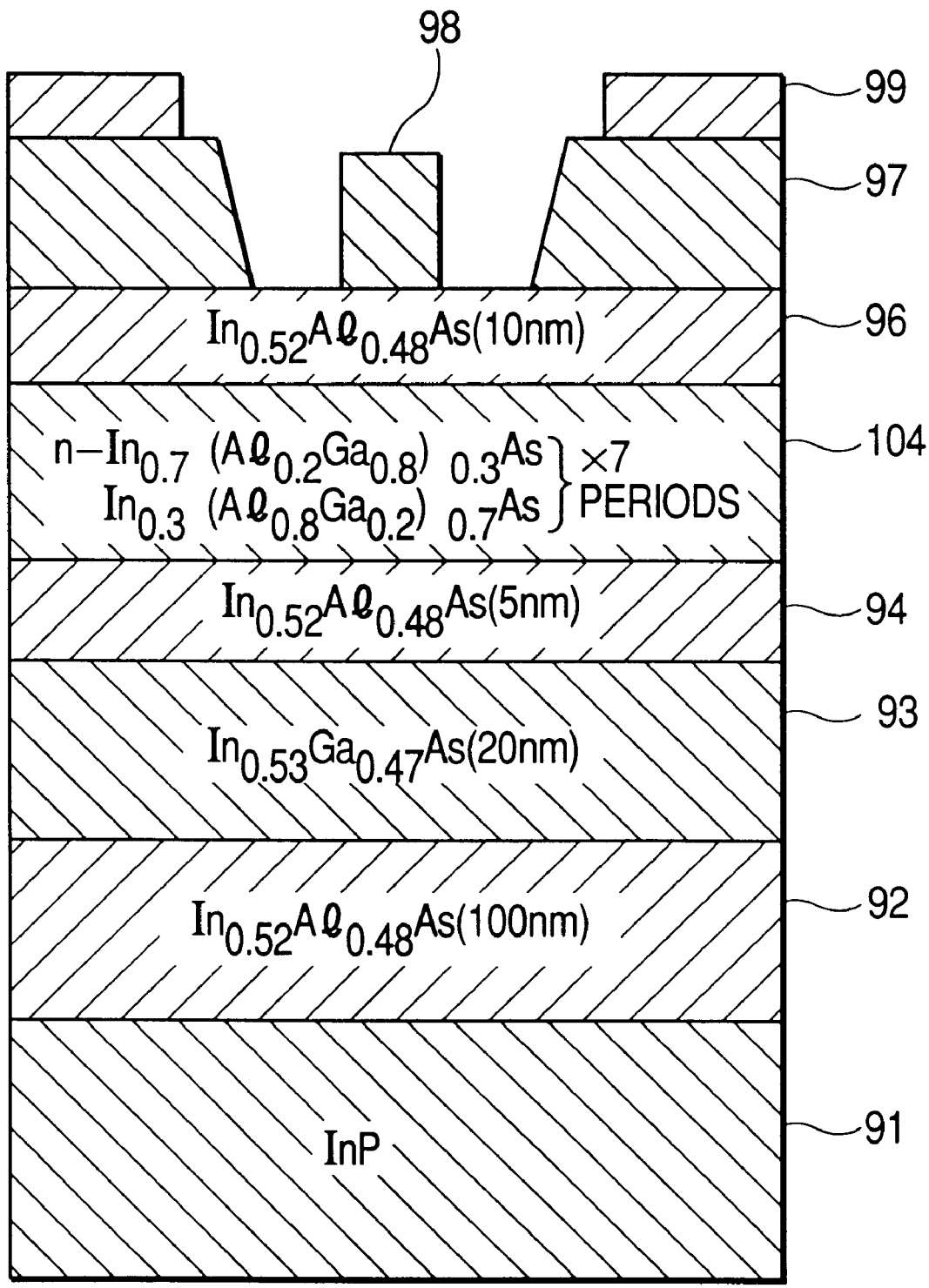
FIG. 25 is a diagrammatic section view of a HEMT in a twelfth embodiment of this invention.

FIG. 25 shows a twelfth embodiment of this invention which is similar to the seventh embodiment thereof except that an electron supply layer (a doped superlattice layer) 104 replaces the electron supply layer 95 (see FIG. 16).

The electron supply layer 104 is composed of non-doped $In_{0.3}(Al_{0.8}Ga_{0.2})_{0.7}As$ layers and Si-doped $In_{0.7}(Al_{0.2}Ga_{0.8})_{0.3}As$ layers which alternate with each other in a laminate. The electron supply layer 104 has seven periods of the alternation. In other words, the electron supply layer 104 has an alternating superlattice structure of seven non-doped $In_{0.3}(Al_{0.8}Ga_{0.2})_{0.7}As$ layers and Si-doped $In_{0.7}(Al_{0.2}Ga_{0.8})_{0.3}As$ layers. Each of the $In_{0.3}(Al_{0.8}Ga_{0.2})_{0.7}As$ layers has a thickness of 1.0 nm. Each of the $In_{0.7}(Al_{0.2}Ga_{0.8})_{0.3}As$ layers has a thickness of 2.0 nm.

Regarding the electron supply layer (the doped superlattice layer) 104, the lattice constant of the $In_{0.3}(Al_{0.8}Ga_{0.2})_{0.7}As$ layers is equal to 5.937 angstroms while the lattice constant of the $In_{0.7}(Al_{0.2}Ga_{0.8})_{0.3}As$ layers is equal to 5.780 angstroms. The thickness of each of the $In_{0.3}(Al_{0.8}Ga_{0.2})_{0.7}As$ layers is equal to 1.0 nm. The thickness of each of the $In_{0.7}(Al_{0.2}Ga_{0.8})_{0.3}As$ layers is equal to 2.0 nm. Accordingly, the mean lattice constant (the average lattice constant) of the electron supply layer 104 is equal to 5.832 angstroms. The mean lattice constant (the average lattice constant) of the electron supply layer 104 deviates from 5.869 angstroms (the lattice constants of the InP substrate 91 and the $In_{0.52}Al_{0.48}As$ layers) by −0.037 angstrom. According to the relation in FIG. 17, the critical thickness is equal to about 300 nm for the −0.037-angstrom lattice-constant deviation.

The electron supply layer (the superlattice doped layer) 104 has seven periods of the alternation of the $In_{0.3}$ $(Al_{0.8}Ga_{0.2})_{0.7}As$ layer and the $In_{0.7}(Al_{0.2}Ga_{0.8})_{0.3}As$ layer. Each of the $In_{0.3}(Al_{0.8}Ga_{0.2})_{0.7}As$ layers has a thickness of 1.0 nm. Each of the $In_{0.7}(Al_{0.2}Ga_{0.8})_{0.3}As$ layers has a thickness of 2.0 nm. Thus, the thickness of the electron supply layer 104 is equal to 21 nm. This thickness of the electron supply layer 104 is smaller than the critical thickness, that is, about 300 nm. Accordingly, it is possible to prevent crystal defects from occurring in the electron supply layer 104 due to lattice mismatching.

The bandgap energy of an $In_{0.3}(Al_{0.8}Ga_{0.2})_{0.7}As$ layer is equal to 0.66 eV. The bandgap energy of an $In_{0.7}(Al_{0.2}Ga_{0.8})_{0.3}As$ layer is equal to 1.67 eV. Thus, the calculation result of the equivalent bandgap energy of the electron supply layer 104 is equal to 1.33 eV. The equivalent bandgap energy of the electron supply layer 104 is greater than that of the electron supply layer 95 in the seventh embodiment of this invention. Accordingly, it is possible to attain a sufficient ability to supply electrons.

In the electron supply layer 104, only the $In_{0.7}(Al_{0.2}Ga_{0.8})_{0.3}As$ layers are doped with Si. In the $In_{0.7}(Al_{0.2}Ga_{0.8})_{0.3}As$ layers, the ratio of the number of Al atoms to the number of In atoms is equal to less than 10%. Therefore, even in the case where a heat treatment (a heating process) is carried out, the carrier concentration of the electron supply layer 104 can be prevented from significantly decreasing due to the entry of fluorine thereinto. Therefore, the electron supply layer 104 is thermally stable.

In the electron supply layer 104, the number of periods of the alternation of the $In_{0.3}(Al_{0.8}Ga_{0.2})_{0.7}As$ layer and the $In_{0.7}(Al_{0.2}Ga_{0.8})_{0.3}As$ layer may differ from seven. In the electron supply layer 104, the thickness of each of the $In_{0.3}(Al_{0.8}Ga_{0.2})_{0.7}As$ layers may differ from 1.0 nm, and the thickness of each of the $In_{0.7}(Al_{0.2}Ga_{0.8})_{0.38}As$ layers may differ from 2.0 nm.

Other Embodiments

Each of the second embodiment, the third embodiment, the fourth embodiment, and the fifth embodiment of this invention may be modified to include a doped layer 81 of n-type $In_{0.52}Al_{0.48}As$ as in the sixth embodiment of this invention.

What is claimed is:

1. A semiconductor device comprising:
   a semi-insulating substrate made of InP;
   a channel layer formed on the semi-insulating substrate; and
   an electron supply layer formed on the semi-insulating substrate for generating a two-dimensional electron gas, the electron supply layer including a doped superlattice layer the superlattice layer including layers of $In_XAl_{1-X}As$ and layers of $In_YAl_{1-Y}As$ which alternate with each other, where X>0.52>Y, the layers of $In_XAl_{1-X}As$ and the layers of $In_YAl_{1-Y}As$ being grown with respect to $In_{0.52}Al_{0.48}As$.

2. A semiconductor device as recited in claim 1, wherein one of X and Y is equal to or smaller than 0.52, and the other of X and Y is equal to or greater than 0.52.

3. A semiconductor device as recited in claim 1, wherein the layers of $In_XAl_{1-X}As$ and the layers of $In_YAl_{1-Y}As$ have thicknesses equal to or smaller than critical thicknesses to prevent dislocation from being caused by lattice mismatching.

4. A semiconductor device as recited in claim 1, wherein one of X and Y is equal to 0.8, and the other of X and Y is equal to 0.2.

5. A semiconductor device as recited in claim 4, wherein the layers of $In_{0.8}Al_{0.2}As$ and the layers of $In_{0.2}Al_{0.8}As$ have thicknesses each equal to about 2 nm, and the layers of $In_{0.8}Al_{0.2}As$ and the layers of $In_{0.2}Al_{0.8}As$ form about five periods of the alternation.

6. A semiconductor device as recited in claim 1, wherein ones of the layers of $In_XAl_{1-X}As$ and the layers of $In_YAl_{1-Y}As$ which relate to a greater of X and Y are doped, and the other ones of the layers of $In_XAl_{1-X}As$ and the layers of $In_YAl_{1-Y}As$ are non-doped.

7. A semiconductor device as recited in claim 1, wherein the electron supply layer includes a δ-doped layer which enables impurities to be locally located.

8. A semiconductor device as recited in claim 1, further comprising a non-doped spacer layer of $In_ZAl_{1-Z}As$ located between the channel layer and the electron supply layer, where $0 \leq Z \leq 0.52$.

9. A semiconductor device as recited in claim 8, wherein Z is equal to 0.52, and the spacer layer has a thickness of 5 nm.

10. A semiconductor device as recited in claim 8, wherein the channel layer is made of non-doped $In_TGa_{1-T}As$, where $0.53 \leq T \leq 1$, and wherein the channel layer is greater in electron affinity than the spacer layer.

11. A semiconductor device as recited in claim 10, wherein the channel layer includes a layer of $In_{0.53}Ga_{0.47}As$ and a layer of $In_{0.8}Ga_{0.2}As$, the layer of $In_{0.53}Ga_{0.47}As$ being closer to the spacer layer and having a thickness of 4 nm, the layer of $In_{0.8}Ga_{0.2}As$ being in contact with the layer of $In_{0.53}Ga_{0.47}As$ and having a thickness of 16 nm.

12. A semiconductor device as recited in claim 1, wherein the electron supply layer is located between the semi-insulating substrate and the channel layer.

13. A semiconductor device as recited in claim 1, wherein the layers of $In_XAl_{1-X}As$ have a lattice constant aX and the layers of $In_YAl_{1-Y}As$ have a lattice constant aY and aX>aY, and $|aX-a0.52|=|aY-a0.52|$ wherein a0.52 denotes a lattice constant of $In_{0.52}Al_{0.48}As$.

14. A semiconductor device as recited in claim 1, wherein X+Y=1, and the layers of $In_XAl_{1-X}As$ have a thickness corresponding to m monolayers per period and the layers of $In_YAl_{1-Y}As$ have a thickness corresponding to n monolayers per period, and $m=n \leq 2$.

15. A semiconductor device comprising:
    a semi-insulating substrate made of InP;
    a channel layer formed on the semi-insulating substrate; and
    an electron supply layer formed on the semi-insulating substrate for generating a two-dimensional electron gas, the electron supply layer including a doped superlattice layer, the superlattice layer including layers of $In_XAl_{1-X}As$ and layers of $In_YAl_{1-Y}As$ which alternate with each other, where X>0.52>Y, the layers of $In_XAl_{1-X}As$ and the layers of $In_YAl_{1-Y}As$ being grown with respect to $In_{0.52}Al_{0.48}As$;
    wherein one of X and Y is equal to 1 and the other of X and Y is equal to 0, and the resulting layers of InAs and the layers of AlAs have thicknesses of each corresponding to two monolayers, and the resulting layers of InAs and the layers of AlAs form twenty periods of the alternation or less.

16. A semiconductor device as recited in claim 15, wherein the layers of InAs and the layers of AlAs form seven periods of the alternation.

17. A semiconductor device comprising:
    a semi-insulating substrate made of InP;
    a channel layer formed on the semi-insulating substrate; and an electron supply layer formed on the semi-insulating substrate for generating a two-dimensional electron gas, the electron supply layer including a doped superlattice layer, the superlattice layer including layers of $In_XAl_{1-X}As$ and layers of $In_YAl_{1-Y}As$ which alternate with each other, where $X>0.52>Y$, the layers of $In_XAl_{1-X}As$ and the layers of $In_YAl_{1-Y}As$ being grown with respect to $In_{0.52}Al_{0.48}As$, wherein said semiconductor device further comprises a doped layer of $In_{0.52}Al_{0.48}As$ which is located between the electron supply layer and the channel layer, the layer of $In_{0.52}Al_{0.48}As$ serving as an electron supply layer.

* * * * *